US012092513B2

(12) United States Patent
Bremner et al.

(10) Patent No.: US 12,092,513 B2
(45) Date of Patent: Sep. 17, 2024

(54) MULTI-WAVEFIELD FLOW SENSING DEVICES AND RELATED METHODS

(71) Applicant: SONELITE INC., Del Mar, CA (US)

(72) Inventors: Paul Graeme Bremner, Del Mar, CA (US); Christopher Todter, San Diego, CA (US)

(73) Assignee: SoneLite Inc.

( * ) Notice: Subject to any disclaimer, the term of this patent is extended or adjusted under 35 U.S.C. 154(b) by 449 days.

(21) Appl. No.: 17/298,929

(22) PCT Filed: Dec. 3, 2019

(86) PCT No.: PCT/US2019/064312
§ 371 (c)(1),
(2) Date: Jun. 1, 2021

(87) PCT Pub. No.: WO2020/117858
PCT Pub. Date: Jun. 11, 2020

(65) Prior Publication Data
US 2022/0034710 A1 Feb. 3, 2022

Related U.S. Application Data

(60) Provisional application No. 62/774,756, filed on Dec. 3, 2018.

(51) Int. Cl.
*G01H 3/12* (2006.01)
*H04R 1/40* (2006.01)
(Continued)

(52) U.S. Cl.
CPC ............. *G01H 3/125* (2013.01); *H04R 1/406* (2013.01); *H04R 3/005* (2013.01); *H04R 19/04* (2013.01);
(Continued)

(58) Field of Classification Search
CPC ........ G01H 3/125; H04R 3/005; H04R 19/04; H04R 2201/003; H04R 2201/401
See application file for complete search history.

(56) References Cited

U.S. PATENT DOCUMENTS 8,917,327 B1 12/2014 Bishay
9,949,033 B2 4/2018 Chen et al.
(Continued)

FOREIGN PATENT DOCUMENTS

JP 2016533695 A 10/2016
JP 2017530580 A 10/2017
(Continued)

*Primary Examiner* — Daniel J Colilla
(74) *Attorney, Agent, or Firm* — Lorenz & Kopf, LLP

(57) ABSTRACT

Sensor devices, systems, and methods for measuring different components of a flow are provided. A sensing arrangement includes a substrate and first and second sensor arrays on the substrate. The first sensor array sensing elements are distributed to obtain measurement data indicative of a first property of an operating environment, such as a turbulent component of a fluid flow. The second sensor array sensing elements are interspersed amongst the first sensor array and distributed to obtain measurement data indicative of a second property of the operating environment, such as an acoustic component of the fluid flow.

18 Claims, 11 Drawing Sheets

(51) Int. Cl.
    *H04R 3/00*         (2006.01)
    *H04R 19/04*      (2006.01)
    *G11C 7/10*        (2006.01)

(52) U.S. Cl.
    CPC ...... *G11C 7/1096* (2013.01); *H04R 2201/003* (2013.01); *H04R 2201/401* (2013.01)

(56) References Cited

U.S. PATENT DOCUMENTS

| | | |
|---|---|---|
| 2006/0137439 A1 | 6/2006 | Mallebay-Vacqueur et al. |
| 2015/0286404 A1* | 10/2015 | Todter .................... G06F 3/061 |
| | | 711/104 |
| 2016/0330545 A1* | 11/2016 | McElveen .............. H04R 1/406 |
| 2019/0128730 A1* | 5/2019 | Stuart ..................... G01S 3/801 |
| 2019/0261108 A1* | 8/2019 | Saksela .................. G01H 3/125 |
| 2019/0387297 A1* | 12/2019 | Shahmurad ............ H04R 1/406 |

FOREIGN PATENT DOCUMENTS

| | | |
|---|---|---|
| WO | 2014089349 A1 | 6/2014 |
| WO | 2020023627 A1 | 1/2020 |

\* cited by examiner

MULTI-WAVEFIELD FLOW SENSING DEVICES AND RELATED METHODS

CROSS-REFERENCE TO RELATED APPLICATIONS(S)

This application is a U.S. National-Stage entry under 35 U.S.C. § 371 based on International Application No. PCT/US2019/064312, filed on Dec. 3, 2019, and which claims priority to U.S. Provisional Patent Application No. 62/774,756, filed Dec. 3, 2018, which are all hereby incorporated in their entirety by reference.

TECHNICAL FIELD

Embodiments of the subject matter described herein relate generally to electronic test systems. More particularly, embodiments of the subject matter relate to a system that collects data from a sensing arrangement that includes multiple sensor arrays for concurrently measuring multiple properties of an operating environment.

BACKGROUND

The prior art is replete with various electronic systems that generate, collect, and process sensor data. In this context, a specific class of sensor devices may provide digital output information that represents a measurable quantity, element, or phenomena. For example, such a sensor may output data which is inherently digital—such as an event counting sensor—or may have analogue-to-digital electronics integrated into the sensor package—such as a modern micro electromechanical systems (MEMS) microphone. A digital sensor device may be configured to measure any of the following, without limitation: electromagnetic energy; fluid flow rate; sound; radio frequency interference; air pressure; temperature; airspeed; and the like. The small dimensions of modern digital sensors have also enabled for the first time, high spatial resolution measurements using an array of many closely spaced sensors to generate a spatio-temporal image or mapping of the measured quantity, rather than just sample point measurements.

One application for measurements using a sensor array is in the field of aero-vibro-acoustics to measure noise transmission through a structure in an aerodynamic or hydrodynamic environment, such as, for example, wind noise in an automobile. Design for control of wind-induced interior noise in an automobile often involves analyzing the exterior flow with respect to the aerodynamic shape. However, wind tunnel testing for analyzing the exterior flow can be costly, and therefore, it is desirable to minimize the amount of time or costs incurred in obtaining measurements. Accordingly, it is desirable to provide sensor arrays capable of measuring or otherwise quantifying multiple different characteristic components of the flow loading in an efficient manner. Furthermore, other desirable features and characteristics will become apparent from the subsequent detailed description and the appended claims, taken in conjunction with the accompanying drawings and the foregoing technical field and background.

BRIEF SUMMARY

An exemplary embodiment of a sensing arrangement includes a substrate, a first sensor array on the substrate, and a second sensor array on the substrate. The first sensor array includes a first plurality of sensing elements, wherein a first distribution of the first plurality of sensing elements on the substrate is configured to obtain a first set of measurement data indicative of a first property of an operating environment. The second sensor array includes a second plurality of sensing elements interspersed among the first sensor array, wherein a second distribution of the second plurality of sensing arrangements on the substrate is configured to obtain a second set of measurement data indicative of a second property of the operating environment.

In another embodiment, a method is provided. The method involves obtaining required data acquisition time and sensor over-range and under-range levels from a user, establishing a logical connection with an array instrument RAM controller, providing a graphical indication of the logical connection to the array instrument and sub-array components to the user, providing a graphical means for the user to specify results data filename and folder and/or path, providing a graphical means for the user to start and stop the data acquisition, providing a means for the user to review how many sensors measured over-range and how many sensors measured under-range signals in each sub-array during the data acquisition period, and providing a means for the user to save the results data to defined filename after reviewing the number of over-range and under-range instances.

In another embodiment, a sensor system is provided. The sensor system includes a flexible support substrate configured to be conformally mounted to curved surfaces and an array of digital sensor devices carried by the flexible support substrate, wherein each of the digital sensor devices is configured to generate a respective digital output signal that conveys raw digital sensor output data. The array of digital sensor devices comprises a lower wavenumber array comprising a first set of the digital sensor devices and a higher wavenumber array comprising a second set of the digital sensor devices, the higher wavenumber array comprises a plurality of sub-arrays comprising respective subsets of the second set of the digital sensor devices, the first set of the digital sensor devices of the lower wavenumber array are uniformly distributed across the flexible support substrate, and sub-arrays of the plurality of sub-arrays are nonuniformly interspersed amongst the first set of the digital sensor devices of the lower wavenumber array. The sensor system also includes an array of random-access memory (RAM) devices carried by the flexible support substrate, the RAM devices directly connected to the digital sensor devices during a data recording operation of the sensor system, such that the RAM devices directly receive the digital output signals, and a controller operatively coupled to the array of RAM devices to synchronously clock the array of RAM devices during the data recording operation, such that the raw digital sensor output data is synchronously written to the array of RAM devices.

In another embodiment, a system is provided that includes means for obtaining required data acquisition time and sensor over-range and under-range levels from a user, means for establishing a logical connection with the array instrument RAM controller, means for providing a graphical indication of the logical connection to the array instrument and sub-array components to the user, graphical means for the user to specify results data filename and folder and/or path, graphical means for the user to start and stop the data acquisition, means for the user to review how many sensors measured over-range and how many sensors measured under-range signals in each sub-array during the data acquisition period, and means for the user to save the results data to defined filename after reviewing the number of over-range and under-range instances.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
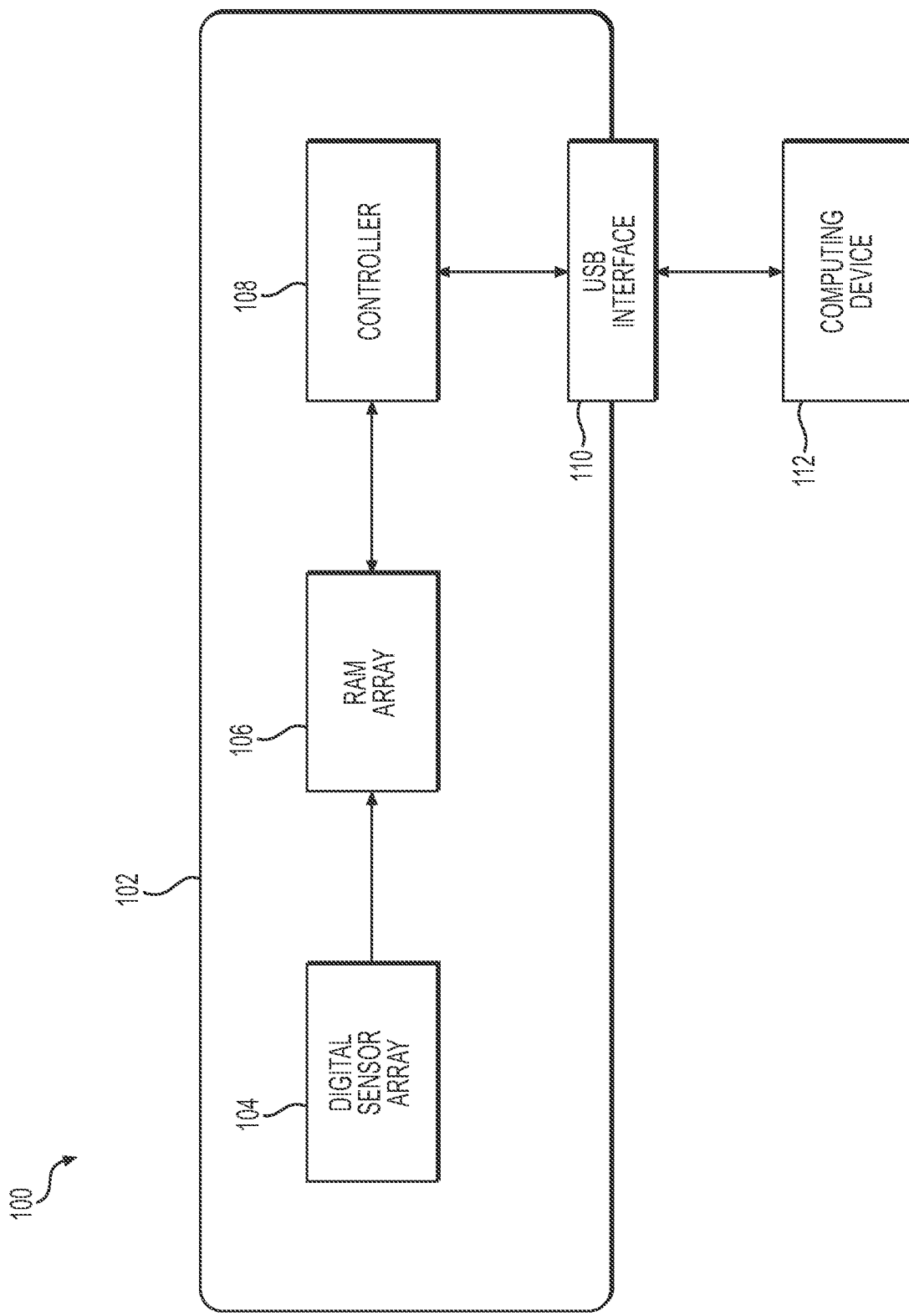
FIG. 1 is a simplified block diagram representation of an embodiment of a sensor system.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies may be described herein in terms of functional and/or logical block components, and with reference to symbolic representations of operations, processing tasks, and functions that may be performed by various computing components or devices. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

For the sake of brevity, conventional techniques related to sensor devices, sensor design, data transmission, data storage, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Embodiments of the subject matter described herein generally pertain to sensing arrangements for measuring flow-induced loading on a structure. In exemplary embodiments, a sensing arrangement includes two or more logically distinct sensor arrays, with the different sensor arrays being arranged or configured to measure different salient properties or characteristics of the surrounding environment resulting from the interaction between a fluid flow and the structure. In this regard, the number of individual sensing elements associated with a respective sensor array and the distribution or positioning of those sensing elements within the respective sensor array may be chosen to optimize a particular property or characteristic of the surrounding fluid flow. For example, a sensor array may itself be made up of a number of different sub-groupings or sub-arrays of sensing elements, with those groupings being distributed, oriented, or otherwise arranged with respect to one another to optimize the capability of the sensor array to capture, measure, or otherwise quantify a particular flow component property or characteristic of the operating environment. Additionally, the different sensor arrays may be provided on a common substrate such that the sensing elements of the different sensor arrays may be interspersed with one another.

In exemplary embodiments, the sensor arrays are provided on a flexible substrate that can conform to the surface of a structure upon which flow-induced loading is to be measured to ensure an aerodynamically smooth measurement surface that minimizes flow disturbance. In one embodiment, pressure sensor arrays are installed on a flexible printed circuit board or flexible polymer printed circuit which is capable of a comb or spiral configuration of flexible fingers which allow the sensor arrays to conform to the shape of a curved surface where the flow measurement is to be taken. The flexible substrate may have a uniform thickness to facilitate an aerodynamic conformal surface for measuring the fluid flow in the surrounding operating environment.

For example, two or more pressure sensor arrays may be integrated into a single measurement instrument to measure two or more components of a flow-induced pressure field which have different characteristic pressure spectrum and/or different characteristic spatial correlation and which can be separated by wavenumber-frequency spectrum analysis. In this regard, one pressure sensor array may have a spacing amongst constituent sensing elements and a dimension, size or other physical arrangement that is designed to resolve a higher wave speed and lower wavenumber flow component in the wavenumber-frequency spectrum, while the other pressure sensor array had a different spacing amongst constituent sensing elements and a different dimension, size or other physical arrangement that is designed to resolve one or more additional lower wave speed and higher wavenumber components in the wavenumber-frequency spectrum.

In some embodiments, the distribution, spacing and/or physical arrangement of sensing elements allows a respective sensor array to use a minimal number of sensing elements to measure only the pressure cross-spectra required to compute the spatial correlation of the measured wavefield. For example, a one-dimensional line array of sensing elements for computing a pressure wavenumber frequency pressure spectrum may not be fully populated, but rather wavenumber-frequency post processing and sparse array signal processing techniques may be utilized to estimate the wavenumber frequency pressure spectrum. Similarly, a two-dimensional rectangular array of sensing elements may not be fully populated, but reliant on wavenumber-frequency post processing and sparse array signal processing techniques may be utilized to estimate the wavenumber frequency pressure spectrum. Furthermore, when one flow component has a significantly higher amplitude pressure spectrum that all other flow components, the sensor arrangement can be further reduced to simple pairs of oriented sensors to quantify pressure spectrum and spatial correlation directly from measured cross spectrum, without recourse to one dimensional or two dimension wavenumber-frequency spectrum analysis.

In some embodiments, a physical structure, such as a windscreen, may be provided on or overlying the exposed surfaces of the sensing elements to effectively provide an anti-aliasing filter that attenuates unwanted high wavenumber signals. In other embodiments, the unwanted high wavenumber content of a low wave speed flow component is removed from the high wave speed, low wavenumber sensor array measurement data by subtracting a curve-fit empirical model of the high wavenumber content which includes an estimate of discrete Fourier transform aliasing or folding error.

In one or more exemplary embodiments, the sensor arrays utilize microelectromechanical systems (MEMS) sensing elements, such as digital MEMS microphones. In some embodiments, all of the digital measurement data from the sensor arrays is stored or buffered in random access memory (RAM) physically installed on the flexible printed circuit board (PCB) substrate of the sensor array measurement instrument using conductive traces on the PCB substrate to establish electrical connections between the output terminals of the sensing elements and the RAM components. A digital data record from a single data acquisition period may be stored in the RAM installed on the substrate of the measurement instrument and subsequently downloaded using a high-speed data link. The measurement data acquisition may be digitally controlled by a software application running on a remote computer, with the software application being capable of generating or otherwise providing a graphical user interface (GUI) display that allows the user to see how many and which sensing elements were over or under the measurement range within the data acquisition period.

As described in greater detail below in the context of FIGS. 2-11, exemplary embodiments described herein provide a flow noise surface pressure sensor array made up of logically distinct groupings or sub-arrays that are configured to fully define the input aero-acoustic or hydro-acoustic loading conditions for a mathematical model to predict the vibration and strain response and the sound transmission of any complex structure exposed to the measured flow disturbance loading. Examples of candidate applications include wind noise on an automobile, boundary layer turbulence loading on an aircraft or spacecraft, wind noise on a high-speed train, underwater flow noise on a sonar system, piping system flow noise, etc. In exemplary embodiments, a sensing arrangement is provided that integrates two or more distinct sensor arrays into a single thin "Stick-on/Peel-off" conformable surface blanket that includes a full blanket-sized array for low wavenumber flow loading plus one or more smaller arrays for high wavenumber, local flow loading. The sensing arrangement may also include perforated screens and porous materials to attenuate unwanted turbulence noise on acoustic array sensors.

The sensing arrangement may also utilize a thin aerodynamic fairing layer with micro-porting between pressure measurement ports in the fairing layer and the sensing ports in the MEMS sensors. For example, a digitally printed fairing layer with suitable micro-porting allows measurements at more closely spaced pressure sensing ports than might be allowed by the spacing based on the smallest physical dimensions of the MEMS sensor package. Acoustic and aerodynamic calibration procedures may be performed to adjust gain and make phase corrections for the effects of such windscreens and micro ports.

In an exemplary embodiment, a conformable sensor blanket incorporates a global 2-dimensional sensor array for low wavenumber aero acoustic loading, which will be acoustics for low, sub-sonic flow speeds and which will be convecting turbulence for higher, supersonic and hypersonic flow speeds. The conformable sensor blanket also incorporates multiple smaller sensor arrays for local variations in high wavenumber loading, which will be convecting turbulence for low, sub-sonic flow speeds and which will be acoustics for higher, supersonic and hypersonic flow speeds. The local, high wavenumber pressure sensor arrays can be either 2-dimensional (2D) arrays to directly measure the local 2D surface pressure frequency-wavenumber spectrum or suitably oriented one-dimensional line arrays or a simpler concentric circle array which defines the local directional cross spectrum properties. The 2D arrays are not required to be fully populated and sparse array signal processing methods can be used to estimate the required frequency-wavenumber spectrum. The complete "Stick-on/Peel-off" conformable sensor array may also leverage the direct data to memory data acquisition described in U.S. Pat. No. 9,921,748, which is incorporated by reference herein in its entirety, to eliminate electrical noise and latency in the recorded measurement data and to avoid a large number of wiring connections to external data acquisition systems. High-speed data acquisition and data download can be facilitated by network or data bus architecture, high-speed data interfaces, and/or high-speed communications protocols.

Sensor System Overview

FIG. 1 depicts a simplified block diagram representation of an embodiment of a sensor system 100 that supports direct data storage to digital memory for an array of digital sensors, as described in greater detail in U.S. Pat. No. 9,921,748, which is incorporated by reference herein in its entirety. The sensor system 100 that generally includes, without limitation: a flexible support substrate 102; an array of digital sensor devices (also referred to herein as a sensor array 104); a random access memory (RAM) architecture that may be realized as an array of physically distinct RAM devices (also referred to herein as a RAM array 106); and a controller 108. The sensor array 104 is coupled to the RAM array 106 to facilitate direct writing of the digital sensor output data from the sensor array 104 to the RAM devices in the RAM array 106. The RAM array 106 is operatively coupled to the controller 108 such that the controller 108 can control data writing and reading operations of the RAM array 106 as needed. For this particular embodiment, the sensor array 104, the RAM array 106, and the controller 108 are all carried by the flexible support substrate 102.

The illustrated embodiment of the sensor system 100 also includes or cooperates with a data interface (e.g., a universal serial bus (USB) interface 110, a wireless data communication interface, or the like). The USB interface 110 is coupled to at least the controller 108 and is suitably configured to accommodate transfer of stored digital sensor output data from the RAM array 106 to a host computing device 112. As is well understood by those familiar with modem computer technology, the USB interface 110 is also configured to provide operating voltage and power to at least some of the components of the sensor system 100, e.g., the sensor devices of the sensor array 104, the RAM devices of the RAM array 106, and the controller 108.

The flexible support substrate 102 enables the sensor array 104, the RAM array 106, and the controller 108 to be conformally mounted or affixed to curved surfaces, such as vehicle windows, vehicle body structures, aircraft skins, or other contoured surfaces under test. In practice, therefore, a direct data-to-memory array can be implemented on a flexible printed circuit board (PCB) or similar electrical substrate to form a conformal array that can follow the shape and curvature of the test subject. The low-profile assembly of sensors and RAM chips on a flexible PCB can be molded into a thin polymer sheet of uniform thickness to provide a convenient "stick on" and "peel off" instrumentation mat or blanket that fully conforms to the underlying curved surface. The fact that the system 100 is scalable by simply adding more RAM devices to support more sensors, but still maintains a single wire interface to the host, means that the system 100 can be manufactured on a very low profile, flexible, conformal circuit board, allowing for test installations directly on the surface without the need for additional machining, or interface wiring or circuitry.

The sensor array 104 includes a plurality of sensing elements. The sensor array 104 preferably includes digital sensor devices of the same type (e.g., microphone devices, temperature sensors, air pressure sensors, light sensors, etc.), although certain embodiments may support a sensor array 104 having multiple different sensor types. Although any suitable type of sensor, transducer, or measurement device could be used in the sensor array 104, the exemplary embodiment described here utilizes microphone devices. As described in greater detail below, in exemplary embodiments, the sensor array 104 is itself made up of multiple logically distinct or different groupings or sub-arrays of sensing elements, with the different sensor array groupings being physically arranged, distributed or configured to measure different salient flow properties or characteristics resulting from a fluid flow. The number, dimensions, and other physical characteristics of the sensor array groupings may vary depending on the needs of the particular application, test subject, testing requirements, etc.

Each sensor device in the sensor array 104 generates a respective digital output signal that conveys the raw digital sensor output data for that particular sensor device. In practice, each sensor device in the sensor array 104 may include a data output terminal or pin that is used to convey the digital information in the form of high and low voltage levels. In turn, each data output terminal or pin is connected to a RAM device in the RAM array 106. The RAM devices can be assigned to the sensor devices in any convenient manner. In other words, each of the RAM devices is operatively associated with at least one of the digital sensor devices in the sensor array 104. In accordance with certain implementations, each physically distinct RAM device of the RAM array 106 includes sixteen inputs and, therefore, each RAM device can receive and write the sensor output data for up to sixteen different sensor devices. It should be appreciated that this 16:1 arrangement is merely one example of a suitable configuration, and that RAM devices with more or less than sixteen data inputs could be utilized if so desired.

The controller 108 is operatively coupled to the RAM array 106, the sensor array 104, and the USB interface 110 to initiate, control, and regulate data reading and writing operations that involve the RAM array 106, and to initiate, control, and regulate the transfer (downloading) of the raw digital sensor output data from the RAM array 106 to the computing device 112 as needed. During data recording operations, the controller provides a common clock signal to each of the RAM devices in the RAM array 106. This common clock signal may also be provided to the individual sensor devices in the sensor array 104. In this regard, the starting, stopping, clocking, and addressing of data storage is handled by the controller 108. In order for the system 100 to be used as a test data acquisition system, the computing device 112 may provide one or more user interfaces, software applications, or the like for resetting the system 100, starting data collection, stopping data collection, and uploading data to the host for post-collection processing. In addition, the clocking of the raw sensor data from the sensor array 104 into the RAM array 106 depends on a controlling address generation and clocking pulses. These tasks are performed by the controller 108, which may include a microcontroller, addressing circuits, multiplexer circuits, and the like, which cooperate to perform the various functions and processes described herein.

The USB interface 110 allows retrieval of the multi-channel array data from the RAM array 106. Data downloading from the RAM array 106 to the computing device 112 is handled by the controller 108. In response to an appropriate user input command, the controller 108 commences data transfer to the host computing device 112 via the USB interface 110. Alternatively, the sensor system may utilize one of many possible high-speed interfaces including but not limited to: PCI, PCI Express, SATA, RS232, RS485, and CAN.

The digital data from the sensor array 104 is a digital representation of a measurable quantity or phenomena that has been converted from some raw analog form to pure digital form. The digital sensor data is generated by the individual sensor devices in the sensor array 104 and is made available in high speed serial format. The raw, original, digital output signals from the sensor array 104 are directly provided to the RAM array 106 without any intervening data processing, filtering, data conditioning, or alteration. Moreover, the RAM devices are located in very close proximity to the sensor devices to avoid long electrical conductor paths and to reduce latency. Thus, the serial data stream is clocked directly into the high-speed RAM devices of the RAM array 106. In other words, there is no sensor conversion or processing in the sensor system 100. The raw sensor data is in digital form and the system 100 captures the high-speed data stream directly into memory in real-time during data recording operations.

For precision sensor arrays, the direct data to memory arrangement minimizes introduction of data acquisition noise and phase errors. Since this system 100 uses a direct sensor to RAM storage system, the sensor data maintains the highest signal-to-noise (S/N) level possible, i.e., that achieved by the sensor devices themselves. There is no possibility of contamination of the sensor output signals (such as from power supply noise, analog-to-digital converter noise), including no introduction of phase delay, jitter or noise, which is critical to precision sensor array measurements.

For large channel count sensor arrays, the direct data to memory design allows the most compact wiring, which can be entirely contained within the multi-layer circuit board. The design is easily scalable, without the need for large numbers of data converters, or wire to host penalties. In addition, regardless of the number of sensor elements, the flexible support substrate 102 maintains its low profile, conformal footprint, and single wire interface to the host.

For near real time processing of sensor array processing, the direct data to memory design minimizes latency. As discussed above, the direct to memory storage means that all data channels (regardless of how large the sensor array 104 is) are stored simultaneously, within a clock and storage jitter window of a few nanoseconds, so that the phase integrity of the sensor array is maintained perfectly.

Moreover, a large number of wiring connections to an external digital signal processing unit is avoided. Indeed, the sensor system 100 can be deployed with minimal wiring connections or no wiring (wireless) connections to external devices during the data acquisition phase. For data transfer, only a single digital data port (e.g., the USB interface 110) connection is required for data download and post-processing of even very high channel count array datasets.

Multi-Wavefield Flow Induced Noise and Vibration

A primary focus in the field of aero-vibro-acoustics is the transmission of noise through a structure, when the exterior source is an aerodynamic or hydrodynamic environment. The subject matter described herein facilitates physics-based simulation methods, which, in turn facilitate engineering design for control of interior noise. The design problem has two parts. The first part is simulation of the exterior flow, as influenced by design parameters such as aerodynamic shape and flow control. The second part is simulation of the transmission of exterior surface pressures to an interior sound field, as influenced by shape and physical properties of the intervening structure. The sound transmission physics of the second part can be used to better define the requirements on wind tunnel testing and computational aero acoustics, which are currently being used for the first part of the problem.

Aerodynamic and hydrodynamic noise transmission has elements in common with the room acoustics problem of sound transmission loss in which the exterior source is assumed to be a diffuse acoustic field. While a structure's vibration response to acoustical excitation may be dominated by its resonant modes, low frequency sound transmission to the interior is controlled by the acoustically forced response of non-resonant modes.

Airplane interior noise transmission can be predicted for high speed boundary layer noise excitation. An empirical model of the boundary layer surface pressure cross spectrum is convolved with each structural mode to estimate the resonant vibration response. At cruise conditions (e.g., Mach 0.8), the high levels of aerodynamic excitation at the convection wavenumber couple well with the resonant modes of the structure so that non-resonant transmission could be neglected. Neither resonant nor non-resonant response couples well with the interior acoustics. The problems associated with low speed flows are more difficult, particularly when there is separated flow over irregularly shaped bodies. Typically, flow Mach numbers for automobiles and submerged vehicles are 0.1 and 0.01, respectively. Boundary layer convected turbulence wavenumbers $k_c=\omega/U_c$ (where $\omega$ is radian frequency and $U_c$ is fluctuating pressure convection speed) are up to two orders of magnitude greater than corresponding acoustical and structural wavenumbers. Under these conditions, the structural resonances with mode shape $\psi_r(x)$ (where x is the surface coordinate vector x,y) present such a strong spatial filter to the excitation that only the very small amplitude, low wavenumber components of the pressure wavenumber-frequency spectrum $\Phi_p(k,\omega)$ need to be used to predict the structure's vibration response (where k is the wavenumber vector $(k_x,k_y)$. The spatial filter or coupling characteristic between the surface pressure cross spectrum $G_{pp}(x,x', j\omega)$ and a structure resonant mode $\psi_r(x)$ is sometimes called the modal joint acceptance. The main problem is estimating the low wavenumber cross spectrum components of the flow excitation, because the amplitude can be small compared with the dominant hydrodynamic turbulence convection wavenumber disturbance.

The acoustic field component of a boundary layer pressure spectrum represents the natural propagation of pressure disturbances away from each instantaneous and localized eddy—at a sufficient distance from the localized eddy, where the pressure has decayed to the small amplitude acoustics range. This acoustic component—although small in amplitude compared to the pressures created by the convecting turbulence eddies—can be vitally important to the sound transmission characteristics or aero-vibro-acoustics problems. The cross-spectrum model for low-speed boundary layer flow can be modeled by the sum of two uncorrelated source components. The two components are the convected turbulence source $\Phi_c(k,\omega)$ and the acoustic source $\Phi_0(k,\omega)$ source, resulting in the equation $\Phi_p(k,\omega)=\Phi_c(k,\omega)+\Phi_0(k,\omega)$, where k is wavenumber (rad/m) and $\omega$ is frequency (rad/sec). Each source component can be described by a surface pressure cross-spectrum. For convenience, the form of the cross spectrum is generally assumed to be separable in frequency and spatial domains. For a homogeneous source, the frequency content is described by the space-averaged auto-spectrum $\overline{G}_p(\omega)$. The degree of phase correlation between pressure loads at any two points—and the phase (apparent wavenumber) relationship of the correlated part— is typically described by a spatial correlation function, transformed to the frequency domain $\gamma_p(x,x',j\omega)$.

The convected turbulence pressure cross spectrum model typically takes the form represented by the equation $G_c$, $(x,x';\omega)=\overline{G}_c(\omega)e^{(-c_x+j)k_c|\Delta x|}e^{-c_y k_c|\Delta y|}$, where $k_c=\omega/U_c$ is the convection wavenumber, $c_x$ and $c_y$ are the spatial coherence decay coefficients in x and y directions, $\Delta x=(x-x')$ and $\Delta y$ (y-y'). The spatial correlation of the acoustic pressure cross spectrum that is induced by boundary layer turbulence for low Mach number flows can be approximated as a diffuse field on the basis that the turbulent eddies are effectively random acoustic sources in space and time, and that any convection effects on the acoustic pressure are negligible. The acoustic pressure cross spectrum can therefore take the form represented by the equation $G_0(x,x';\omega)=\overline{G}_0(\omega)\sin(k_0|\Delta x|)/k_0|\Delta x|$, where $\overline{G}_0(\omega)$ is the auto-spectrum of space-averaged acoustic pressure.

The coupling between the pressure field and the mode shapes of the responding structure can be represented using the equation $\Phi_{pmn}(\omega)=\iint_{k_\omega}\Phi_p(k,\omega)|S_{mn}(k)|^2\,dk$, where the mode shape function is defined as $S_{mn}(k)=\iint_A\omega_{mn}(x)e^{-jkx}dx$, and $\Phi_p(k,\omega)$ is the wavenumber-frequency pressure spectrum for the excitation field and A is the flow-loaded surface area of the structure.

The product of the typical wavenumber spectra for the modes of a panel (simply supported or clamped boundary conditions) and turbulent boundary layer excitation at a given frequency would result in a spectrum with two major peaks corresponding to the main modal peak and the turbulent boundary layer peak. At aerodynamic coincidence, the two peaks would overlap, and the coupling would be at an overall maximum. $\Phi_{mn}(\omega)$, can be related to the joint acceptance function in frequency analysis by the relationship governed by the equation $$j_{mn}^2(\omega) = \frac{U_c^2}{\omega^2} \frac{\Phi_{mn}(\omega)}{\Phi_p(\omega)},$$

where $\Phi_p(\omega)$ is the excitation pressure spectral density and $U_c$ the pressure field convection velocity. It may be assumed that the boundary layer pressure field is temporally stationary and spatially homogeneous. Then the pressure field can be expressed as a cross correlation function that decays with spatial and time separation and convected with the flow. The velocity spectral density of the structure is then represented by equation $$\Phi_v(\omega) = \sum_{m,n} \frac{\Phi_{pmn}(\omega)}{|Z_{mn}(\omega)|^2} = \sum_{m,n} \frac{\omega^2 \Phi_{pmn}(\omega)}{\mu_{mn}^2 |Y_{mn}(\omega)|^2},$$

where $Z_{mn}(\omega)$ is the modal impedance of the structure and $\mu_{mn}$ is its modal mass and $Y_{mn}(\omega)$ is modal admittance. The acoustic radiation efficiency in terms of wavenumber can be given by the equation $$\sigma_{mn} = \frac{1}{4\pi^2 A} \int \int_{k<k_o} |S_{mn}(k)|^2 \left[1 - \left(\frac{k}{k_o}\right)^2\right]^{-0.5} dk,$$

where $k_o = \omega/c_o$.

For structural and boundary layer parameters typical of aircraft in cruise, the response of rectangular plates to turbulent boundary layer excitation occurs in resonant, acoustically inefficient plate modes whose contributions dominate acoustic radiation whether or not they are strongly driven by the boundary layer. When the modes are strongly driven by the boundary layer, the excitation levels are determined by the convective peak of the wavenumber—frequency spectrum, which is where most of the fluctuating energy lies, and the radiated sound is sensitive to details of the shape and location of the peak. When the modes are weakly driven by the boundary layer, the sub-convective region of the wavenumber-frequency spectrum is important and differences between models at low wavenumbers lead to corresponding discrepancies in radiated sound predictions.

For the automotive wind noise application, the flow speed is considerably slower and more separated than the aircraft boundary layer case. The sound power transmitted to the interior acoustic space may be estimated using the equation $\Pi_{\Delta\omega}^{rad} = \rho_0 c_0 A \langle \sigma_{rad} \rangle_{\Delta\omega} \int_{\Delta\omega} \Phi_v(\omega) d\omega$, where $\langle \sigma_{mn} \rangle_{\Delta\omega}$ is the modal radiation efficiency averaged over the modes which are resonant in the analysis frequency band. This effectively assumes that all of the sound power is radiated by the resonant vibration modes in the structure. However, the non-resonant (mass-controlled) modes can provide an additional sound power transmission path, typically at low frequencies, where the mass-controlled impedance of these modes is very low.

The foregoing modal formulation can be expanded to explicitly include the resonant and non-resonant contributions to transmitted sound. The total sound power radiated to the interior may be represented with the equation $$\Pi_{\Delta\omega}^{rad} \propto \rho_0 c_0 A \int_{\Delta\omega} d\omega \sum_{mn} \frac{\omega^2 \Phi_0 j_{mn}^2(\omega) \sigma_{mn}(\omega)}{\mu_{mn}^2 |Y_{mn}(\omega)|^2}.$$

The resonant versus non-resonant contributions can be separated in the modal summation. Neglecting stiffness-controlled modes and dropping the frequency dependence notation, the total power can be portioned and represented by the equation $$\Pi_{\Delta\omega}^{rad} \propto \rho_0 c_0 A \int_{\Delta\omega} d\omega \left\{ \sum_{\omega_{mn} \in \Delta\omega} \frac{\omega^2 \Phi \sigma_{mn}^2(\omega)}{\mu_{mn}^2 |Y_{mn}|^2} + \sum_{\omega_{mn} < \Delta\omega} \frac{\Phi \sigma_{mn}^2(\omega)}{\mu_{mn}^2} \right\},$$

where the product term $j_{mn}^2(\omega)\sigma_{mn}(\omega)$ is replaced by $\sigma_{mn}^2(\omega)$ because the joint acceptance is proportional to radiation efficiency when the excitation is a diffuse acoustic field. The term on the left represents the power radiated by the resonant modes ($\omega_{mn} \in \Delta\omega$) and the term on the right represents the power transmitted by the mass-controlled modes ($\omega_{mn} < \Delta\omega$). For automotive glass panels and a diffuse acoustic excitation field, the non-resonant modes provide the dominant transmission path below 2,000 Hz, and the resonant modes provide the dominant path above 2,000 Hz.

For the case of low speed, highly separated flow—such as wind noise—the exterior pressure spectrum is the sum of a high energy turbulence spectrum $\Phi_c(k_c, \omega)$ and a lower level, uncorrelated diffuse acoustic spectrum $\Phi_0(k_0, \omega)$. The total sound power radiated to the interior of the automobile can, therefore, be expanded, into four terms:

$$\Pi_{\Delta\omega}^{rad} \propto \rho_0 c_0 A \int_{\Delta\omega} d\omega \left\{ \sum_{\omega_{mn} \in \Delta\omega} \frac{\omega^2 \Phi \sigma_{mn}^2(\omega_{mn}) + \omega^2 \Phi_c j_{mn}^2(\omega) \sigma_{mn}(\omega_{mn})}{\mu_{mn}^2 |Y_{mn}|^2} + \sum_{\omega_{mn} < \Delta\omega} \frac{\Phi_0 \sigma_{mn}^2(\omega) + \Phi_c j_{mn}^2(\omega) \sigma_{mn}(\omega)}{\mu_{mn}^2} \right\}.$$

The first two terms are the power radiated by the resonant modes, as driven by the acoustic, $\Phi_0$, and turbulence, $\Phi_c$, spectral components, respectively. Each power component is the product of two modal coupling terms; each such term is a product in wavenumber space. The high-energy turbulence excitation only weakly drives the panel resonances, so that quite low levels of acoustic excitation may transmit a similar amount of sound power—especially for acoustically "fast" modes ($k_{nm} \leq k_0$). The last two terms are the power radiated by the non-resonant modes, as driven by the acoustic $\Phi_0$ and turbulence $\Phi_c$ spectrum components, respectively. The left term is the acoustic mass-law that will transmit a significant amount of acoustic power $\Phi_0$—because a number of the non-resonant modes will always be acoustically "fast" ($k_{nm} \leq k_0$). However, the high-energy turbulence excitation is so weakly coupled to non-resonant modes that its power contribution can usually be neglected.

As shown for the automotive wind noise application above, the vibration, dynamic strain and acoustic radiation response of structures loaded by any proximate flow field, depends on both the surface pressure spectrum and its spatial correlation. The spatial correlation is defined by a phase speed and frequency-dependent wavenumber represented as $$k_i = \frac{2\pi f}{U_i} \text{ (rad/m)},$$

and a spatial correlation decay function which takes a form similar to $|\gamma_{12}|=e^{-kc|\Delta x_{12}|}$ (rad/m) For any flow field with Mach numbers significantly less than unity or significantly greater than unity, the flow loading will by definition contain two or more components with significantly different spatial correlation. The low Mach flow $U_i \ll c_0$ will have both low wavespeed, high wavenumber "hydrodynamic" loading component and a higher speed, low wavenumber acoustic component. For high Mach flow such as hypersonic aircraft flight or hot supersonic jets, $U_i > c_0$ will have both high wavespeed, low wavenumber "hydrodynamic" loading component and a lower speed, high wavenumber acoustic component. Wavenumber filtering is necessary to separately define the "slow" (high wavenumber) loading pressure spectrum and spatial correlation and the "fast" (low wavenumber) loading pressure spectrum and spatial correlation.

As described in greater detail below, the subject matter herein provides a pressure sensing arrangement composed of multiple different logical groupings or arrays of sensing elements for obtaining different sets of measurement data corresponding to the "slow" (high wavenumber) loading pressure spectrum and spatial correlation and the "fast" (low wavenumber) loading pressure spectrum and spatial correlation, respectively.

Multi-Wavefield Flow Sensing Arrangement Overview

Flow induced sound and vibration in structures can be predicted if the wavenumber-frequency spectrum of pressure fluctuations under the flow can be measured. The flow may contain both (incompressible) turbulence pressure fluctuations and (compressible) acoustic pressure fluctuations with significantly different characteristic wavenumbers. The structure sound and vibration response to these two different source components depends on the spatial coupling or joint acceptance between the fluid loading and the vibro-acoustic resonant responses. The smaller of the two flow pressure fluctuations (convecting turbulence, acoustics) quite often results in the largest flow induced sound or vibration in the structure. This often leads to a signal-to-noise measurement problem—having to measure low levels of one component of flow pressure fluctuations in the presence of much larger pressure fluctuations in the other component.

Exemplary embodiments described herein provide a flow noise surface pressure sensing arrangement that is configured to obtain sets of measurement data that fully define the input aero-acoustic and hydro-acoustic loading conditions for the aforementioned mathematical models to predict the vibration response and the sound transmission of any complex structure exposed to flow disturbance loading, namely, a set of measurement data characterizing the "slow" (high wavenumber) loading pressure spectrum and spatial correlation and another set of measurement data characterizing the "fast" (low wavenumber) loading pressure spectrum and spatial correlation. While the subject matter may be employed in the context of measuring any number or combinations of properties or characteristics of a surrounding environment, for purposes of explanation, the subject matter is described herein primarily in the context of measuring a fluid flow interacting with a structure, such as, for example, wind on an automobile, aircraft, spacecraft, or other vehicle. In this regard, the pressure sensing arrangement includes a first logical grouping or array of sensing elements, with the sensing elements being physically arranged or otherwise distributed across a substrate with respect to one another in a manner that is configured to optimize the spectral resolution and signal to noise ratio (SNR) of the measured wavenumber-frequency spectrum characterizing the high wavenumber, hydrodynamic loading pressure spectrum of a fluid flow. A second logical grouping or array of sensing elements, with the sensing elements being physically arranged or otherwise distributed across the substrate with respect to one another in a manner that is configured to the spectral resolution and signal to noise ratio (SNR) of the measured wavenumber-frequency spectrum characterizing the low wavenumber, acoustic loading pressure spectrum of the fluid flow. The sensing elements of the different groupings may be interspersed amongst one another across a common substrate that is flexible and capable of conforming to the structure to be measured.

In one or more exemplary embodiments, the low wavenumber pressure measuring array of sensing elements is distributed across the substrate in a uniform manner to obtain "global" pressure measurement data, while the high wavenumber pressure measuring array of sensing elements is itself made up of smaller sub-arrays or sub-groupings of concentrated sensing elements for obtaining "local" pressure measurement data at different locations or regions of the flow over the structure. In exemplary embodiments, each of the low wavenumber and high wavenumber sensor arrays typically include between 8 and 128 individual sensing elements, with the two arrays being integrated on a thin conformable substrate or "blanket" that can be applied in a "stick-on/peel-off" fashion to any flow-impinged structural surface without significantly altering the flow field. The conformable blanket is fabricated so as to allow encapsulation or mounting of one or more sensor arrays, some or all of the required support electronics, and interconnections, such as described above in the context of FIG. 1. In this regard, the substrate may be both flexible to allow multi-curvature compliance while also capable of supporting the various components provided thereon and providing the strength or durability to allow its reliable use and reuse in rugged industrial or testing environments. The edges of the sensor blanket may be aerodynamically and/or hydro-dynamically faired to the rest of the structure with modeling clay or equivalent filling material. While the subject matter is described herein in the context of pressure sensing elements (microphones), additionally or alternatively, the arrays could incorporate other sensor types, such as temperature or acceleration sensors.

In one or more embodiments, the low wavenumber sensor array is realized as a 2D array of sensing elements that spans the substrate to measure low wavenumber aero-acoustic or hydro-acoustic loading, which will be acoustics for low flow speeds (sub-sonic) and convecting turbulence for higher flow speeds (supersonic and hypersonic). For example, the low wavenumber sensor array may be rectangular 2D array that spans the full length and width of the substrate, with the spacing between sensing elements being determined by the required Nyquist spatial sampling frequency of the low wavenumber pressure fluctuations. The wavenumber resolution of the array is then determined by the length $L_x$ and width $L_y$ of the array. For example, for frequency range 8000

Hz and convection velocity 27 m/s, the maximum wavenumber to be resolved is 1,860 rad/m and from the Nyquist spatial sampling criteria, the sensor spacing dx is determined to be 1.7 mm. For a one-dimensional array of 64 sensors, the array length will be 109 mm which results in a wavenumber spectral resolution dk of 50 rad/m. In this regard, it should be noted that fully populating the dimensions of the substrate with sensing elements of the low wavenumber sensor array maximizes the wavenumber resolution of the array and facilitates direct estimation of the total space-averaged pressure frequency spectrum over the full measurement surface. That said, the 2D array is not required to be fully populated and sparse array signal processing methods could alternatively be used to estimate the required frequency-wavenumber spectrum.

For the measurement of low wavenumber pressure fluctuations in the presence of masking by high wavenumber pressure fluctuations, perforated screens and/or porous materials are applied to each of the sensing elements to physically attenuate unwanted high wavenumber "noise" on the sensors. This effectively provides a spatial anti-aliasing filter in the wavenumber domain. When applied at the sensor, it attenuates high wavenumber pressure fluctuations and reduces anti-aliasing errors in the desired, low wavenumber pressure spectrum. For moderate levels of high wavenumber masking and at higher frequencies, windscreens may be sufficient to directly measure low wavenumber surface pressure fluctuations directly. For applications where high wavenumber masking is significant on pressure sensors with windscreens a 1D or 2D array of microphones can be used to support wavenumber filtering.

In exemplary embodiments, the conformable sensing arrangement also incorporates a high wavenumber sensor array that is made up of multiple smaller sensor sub-arrays or sub-groupings for measurement of local variations in high wavenumber aeroacoustic or hydroacoustic loading, which will be convecting turbulence for low flow speeds (subsonic) and acoustics for higher flow speeds (supersonic and hypersonic). In exemplary embodiments, the high wavenumber sensor sub-arrays are smaller than the dimensions of the sensing arrangement and are sized to provide the required high wavenumber spectral resolution. This allows multiple smaller, high wavenumber sub-arrays to be integrated at different locations on the conformal sensor blanket to measure variations in local flow frequency-wavenumber pressure spectrum. In this regard, the high wavenumber sensor array (and the constituent sub-arrays or sub-groupings of sensing elements) may not span, encompass, or otherwise attempt to obtain measurements over the full measurement surface, but rather concentrate measurements to a select few locations or distinct regions on the surface.

For the measurement of high wavenumber pressure fluctuations, the conformal sensing arrangement may utilize a thin aerodynamic fairing with micro-porting to accommodate pressure sensing ports with a smaller spacing than would be possible based on close-packing of the MEMS sensor packages. The micro-porting can be manufactured to tight dimensional tolerances on very small diameter ports down to 0.1 mm diameter using digital printing of an aerodynamically faired plastic manifold molded into the conformal sensor blanket.

As described above, the direct data to memory data acquisition described in U.S. Pat. No. 9,921,748 may be employed to eliminate electrical noise and latency in the recorded data and to avoid a large number of wiring connections to external data acquisition systems. Due to the high frequency sampling employed by the array elements to ensure high bandwidth acquisition, and the large number of sensing elements, such data acquisition methods are employed to ensure the simultaneity of all the sensor samples, as well as minimize latency so that the sensor data can be synchronized with other externally measured data. Additionally, a large amount of data collected per test may be available for analysis with a minimum time delay. Such data acquisition techniques may include one or more of the following: parallel direct sensor to a single unified memory block storage, under clocking and address control of a microcomputer; high speed interleaved or multiplexed sensor to memory storage, but utilizing multiple data streams from groups of sensors to separate memory blocks; use of multiple microcomputers, each operating on a group of sensors and a memory storage block; use of a microcomputer with integrated memory of sufficient size to capture the sensor data from a test (e.g., by direct parallel means or by a high speed interleaved serial data stream prior to transmission to a larger computer for analysis via a high speed data communications bus or protocol); use of multiple microcomputers each interfacing with a group of sensors, and providing a high speed data path via a serial communications bus or medium directly to a storage medium such as flash memory, universal serial bus (USB) storage, solid state hard drive, or directly to a computer. Multiple data streams may be reconstituted in the analysis process so as to provide the entire sensor data set in synchronized parallel format. The sets of measurement data obtained via the respective sensor arrays may ultimately be transmitted to a server, laptop or other computer for post-test processing and analysis.

Multi-Wavefield Array Design Process

In exemplary embodiments, the arrays of sensing elements of the conformable sensing arrangement are designed based on the number of different wavefield components required to fully describe the flow field aero-acoustic or hydro-acoustic loading on the structure as the sum of multiple space-averaged, homogenous surface pressure cross spectra, represented by equation $G_{pp}(x_1,x_2,j\omega)=G_{00}(x_1,x_2,j\omega)+G_{11}(x_1,x_2,j\omega)+L+G_{nn}(x_1,x_2,j\omega)$ or as the sum of corresponding surface pressure wavenumber-frequency spectra represented by equation $\Phi_p(k,\omega)=\Phi_0(k,\omega)+\Phi_1(k,\omega)+L\,\Phi_n(k,\omega)$. The characteristic convection speed $U_i$ and direction for each hydrodynamic component and the propagation speed $c_0$ and direction (or trace velocities $U_{t,x}$, $U_{t,y}$) for each acoustic component of the flow field aeroacoustic loading model to be used are then estimated. For complex aeroacoustic sources, such as a rocket plume interacting with a launch structure, it may be necessary to first perform screening pressure measurements to identify and rank the statistically independent sources. This can be done using principal component analysis, proper orthogonal decomposition, Karhunen-Loeve transform or related signal processing methods, which are not germane to the subject matter described herein. For purposes of explanation, the design process may be described herein in the context of assuming only two components—an acoustic component and a hydrodynamic flow component with Mach significantly less or greater than unity. The two components will be referred to as the "fast" and "slow", corresponding to their relative wavespeeds $U_F$, $U_S$. It should be appreciated by those skilled in the art that the subject matter described herein can be extended to additional flow components.

An optimal sensor array provides the spectral resolution and signal to noise ratio (SNR) required to quantify the wavenumber-frequency spectrum of the multiple, spatiotemporal flow components. To design an optimal sensor array that will reliably separate the Fast and Slow components in the pressure wavenumber-frequency spectrum $\Phi_{pp}(k,\omega)$, the following array measurement parameters needs to be defined: the shape and approximate rectangular dimensions ($L_x, L_y$) of the surface over which the array measurements will be made, the desired maximum and minimum frequencies ($f_{min}, f_{max}$), and the desired wavenumber spectrum resolution for Fast and Slow components ($\Delta k_x, \Delta k_x)_{F,S}$. The minimum array sensor spacing dr for satisfying Nyquist sampling constraints for the two wavefield components may then be computed using the equations $$dr_F \le \frac{U_F}{2f_{max}}, dr_S \le \frac{U_S}{2f_{max}}.$$

The separation equation $dr_F=(dx_F, dy_F)$ may be utilized to determine the number of sensing elements for a single sensor array over the whole surface area, that is, the low wavenumber sensor array. For a rectangular, two-dimensional array, the number of sensors is defined by $$N_{F,x} = \frac{L_x}{dx_F}, N_{F,y} = \frac{L_y}{dy_F}.$$

When using discrete Fourier transform (DFT) methods to calculate $\Phi_F(k,\omega)$ from this array, the wavenumber resolution ($\Delta k_x, \Delta k_x$) will be defined by dimensions of the array $L_x, L_y$. If the corresponding resolution does not achieve the desired resolution ($\Delta k_x, \Delta k_x)_F$, the array dimensions larger may be increased and/or the desired wavenumber resolution may be reduced. While this sensor array is optimized to measure the fast flow wavenumber-frequency spectrum $\Phi_F(k,\omega)$, the measurement data will be subject to DFT aliasing or folding error from the higher wavenumber spectrum content of the slow components. The DFT aliasing or folding error may be removed, for example, by physically filtering the high wavenumber content with an acoustic foam or equivalent porous medium placed in front of each fast array pressure sensor and/or by performing post-processing to remove the aliasing error in a wavenumber spectrum post-processing step. For example, the fast wavenumber spectrum $\Phi_F(k,\omega)$ may be quantified by curve fitting an empirical model to the total measured $\Phi_{pp}(k,\omega)$ that includes an empirical model of the aliasing $\Phi_{Alias}(k,\omega)$ and performing simple subtraction in wavenumber space $\Phi_F(k,\omega)=\Phi_{pp}(k,\omega)-\Phi_{alias}^S(k,\omega)$ The high wavenumber sensor array and sub-arrays thereof are designed to accurately measure the slow components of the flow field aeroacoustic or hydroacoustic loading. The slow wavespeed component by definition has higher wavenumbers and shorter characteristic correlation lengths than the fast wavefield. Therefore, a smaller array with smaller sensor spacing $$dr_S \le \frac{U_S}{2f_{max}}$$

is utilized to resolve the maximum wavenumber of the slow wavespeed flow component. The dimensions of the high wavenumber sub-arrays may be determined by the DFT wavenumber resolution requirement ($\Delta k_x, \Delta k_x)_S$, or alternatively, by practical limitations on the number ($N_x, N_y)_S$ of sensors dictated by the dimensions of the sensing arrangement substrate governed by equation $L_x^S=N_x^S dx_S, L_y^S=N_y^S dy_S$. Since the slow wavefield has short correlation lengths, it is less likely the slow component of the aeroacoustic flow field will be homogenous over the whole area of the substrate, and therefore, multiple smaller high wavenumber-measuring sub-arrays are interspersed or otherwise distributed amongst the low wavenumber sensor array.

Each high wavenumber-measuring sensor sub-array is capable of measuring sufficiently high wavenumbers that the resulting wavenumber frequency spectrum will include both fast (low wavenumber) and slow spectral energies. The fast (low wavenumber) content can be removed by wavenumber filtering or by curve fitting an empirical model of the fast energy and subtracting it from the total wavenumber spectrum measured by the array, represented by equation $\Phi_S(k,\omega)=\Phi_{pp}(k,\omega)-\Phi_{fit}^F(k,\omega)$ If physical anti-aliasing windscreens are not required on the fast array pressure sensors, then the smaller slow component sub-array sensors can be positioned for dual use of as many fast array sensors as possible, to minimize the sensor count. That is, a sensing element could concurrently be part of the low wavenumber sensor array and the high wavenumber sensor array.

The particular sensor array configuration can be done independently for each fast and slow sensor array (or sub-array). The array of sensing elements may be chosen as the best application-specific compromise between wavenumber resolution and number of sensors and/or related costs or complexity of measurements. For example, the low wavenumber sensor array and/or the high wavenumber sensor sub-arrays could be realized as two-dimensional (2D) sensor arrays, oriented one-dimensional (1D) sensor arrays, concentric circle arrays or any other combination or topology of sensing element configurations.

Automotive Application Example

Figure 2:
FIG. 2 depicts a perspective view of a conformable sensing arrangement overlying a structure in an exemplary embodiment.

FIG. 2 depicts an exemplary embodiment of a conformable sensing arrangement 200 provided on an exterior surface of a vehicle 202, such as the window of an automobile. As described above, the sensing arrangement 200 may be affixed or otherwise provided on and in contact with the exterior surface of the window in a stick-on/peel-off manner, for example, by use of an adhesive provided on a backside of a substrate 210 of the sensing arrangement 200. In the illustrated embodiment, the sensing arrangement 200 includes an array 220 of sensing elements 222 that are uniformly distributed across the length and width of the substrate 210 to provide a 2D low wavenumber sensor array 220. The sensing arrangement 200 includes another array 230 of sensing elements 232 that are arranged in logical sub-groupings or sub-arrays 234 that are interspersed amongst the low wavenumber sensor array 220 and distributed across the substrate 210 in a manner that is configured to provide the spectral resolution and signal to noise ratio (SNR) required to quantify the wavenumber-frequency spectrum of the high wavenumber fluid flow field. In this regard, a sensing element 232 utilized for the higher wavenumber measurements may reside between uniformly spaced sensing elements 222 utilized for the lower wavenumber measurements which would otherwise have been neighboring or adjacent to one another subject to the minimum spacing for the lower wavenumber array. In such situations, the spacing or separation distance between a higher wavenumber sensing element 232 and a lower wavenumber sensing element 222 may be less than the minimum spacing determined for the lower wavenumber array, as described in greater detail below. In exemplary embodiments, each of the sensing elements 222, 232 is realized as a MEMS microphone acting as a fluctuating surface pressure (FSP) load sensing element; however, it should be noted that in other embodiments the sensing elements 222, 232 may be of different types and the subject matter described herein is not limited to any particular type or combination of sensing elements 222, 232. That said, for purposes of explanation, the subject matter may be described herein in the context of MEMS microphones.

The conformable sensing arrangement 200 may be utilized to measure fluctuating pressure loads on the glass window surface (or alternatively the automotive body) in order to quantify the sources of interior wind noise. At conventional road speeds of Mach <0.1, the streamwise convection velocity of the turbulence loading is spatially characterized by a convection wavenumber k, (rad/m) which is at least an order of magnitude larger than acoustic propagation wavenumber. The amplitude of the acoustic component of fluctuating surface pressure (FSP) is typically 20-40 decibels (dB) lower than the amplitude of convecting turbulence FSP. Accordingly, it is desirable to use an array surface microphones and wavenumber analysis to separate the acoustic and convecting turbulence flow loading components, using wavenumber filtering.

The conformable sensing arrangement 200 effectively provides a single FSP array that is capable of acquiring all of the required wind noise loading data in a cost-effective manner. In this regard, wind tunnel measurement time is costly, and it is not cost-effective for automotive manufacturers to move MEMS FSP array sensors around. In the embodiment of FIG. 2, wind loading from low wavenumber acoustics is measured with the larger array 220 of uniformly distributed and wider-spaced MEMS microphones 222 and more localized turbulence wind loading is measured using the smaller sensor sub-arrays 234 of clustered or concentrated MEMS microphones 232 provided at distinct or localized regions or locations.

In some embodiments, when the low wavespeed, high wavenumber FSP is higher amplitude than low wavenumber acoustics, the array can be reduced to a minimum number of sensing elements required for measuring only the pressure cross-spectra between a small number of oriented sensor pairs and computing the spatial correlation of the flow-induced pressure field. In other embodiments, a high wavenumber local turbulence array may be realized as a one-dimensional line array of sensors or a two-dimensional rectangular array of sensors. In such embodiments, the array may not be fully populated, but rather wavenumber-frequency post-processing may utilize sparse array signal processing techniques on the measurement data obtained from the sparsely populated array to estimate the pressure wavenumber-frequency spectrum.

FIGS. 3-6 depict an exemplary embodiment of a conformable sensing arrangement 300 suitable for use as the sensing arrangement 200 in FIG. 2. The sensing arrangement 300 includes a low wavenumber array of sensing elements 302 (e.g., sensing elements 222) distributed across a flexible electronics substrate 310 along with a high wavenumber sub-arrays 304 (e.g., sub-arrays 234) interspersed amongst the low wavenumber sensing elements 302 at disparate locations on the substrate 310. In exemplary embodiments, the electronics substrate 310 is molded into or otherwise physically integrated with a conformable encapsulating structure 320 that encompasses the electronics substrate 310, which, in turn may be affixed, adhered, or otherwise mounted on a surface with respect to which fluid flow is to be measured, such as a surface of the vehicle 202.

In exemplary embodiments, the conformable encapsulating structure 320 is realized as a sheet, blanket, or similar substantially planar layer of a flexible material, such as silicone rubber. The encapsulating layer is chosen to be electrically insulating, flexible enough to allow the array to conform closely to the doubly curved structure surface and durable enough to allow several hundred installations and de-installation over the expected life of the array. In exemplary embodiments, the conformable encapsulating structure 320 has a substantially uniform thickness to present an aerodynamically smooth surface. As described above, in exemplary embodiments, the encapsulating layer 606 may be desirably be made as thin as practicable typically in the 2-5 mm range with uniform thickness to improve aerodynamic characteristics of the conformable sensing arrangement and limit or otherwise minimize fluid flow perturbations attributable to the geometry of the conformable sensing arrangement.

In exemplary embodiments, the electronics substrate 310 is realized as a thin printed circuit board, however, in other embodiments, the substrate 310 could be realized as a flexible polymer circuit or as a network of smaller printed circuit boards connected by flexible polymer circuit or wiring strips. In the illustrated embodiment of FIG. 3, the electronics substrate 310 is cut into a multi-finger configuration for improved conformability to curved structures.

When utilized in connection with the direct data storage to digital memory techniques described in U.S. Pat. No. 9,921,748, the electronics substrate 310 also may include or otherwise support one or more controllers and memory elements mounted or otherwise provided thereon (e.g., RAM arrays) and conductive electrical traces between sensing elements and memory elements as described therein. The electronic controllers and RAM arrays may be separately dedicated to each physical measurement sub-array or may be integrated into a single controller and RAM array to store digital outputs from all sub-arrays in a sequentially coded manner. The controllers and RAM array may be integrated directly on the array instrument—on the PCB and within the encapsulating conformal layer—or may be implemented on a separate PCB remote from the array measurement instrument, with electrical connections via flexible polymer circuit elements or ribbon cables.

Figure 4:
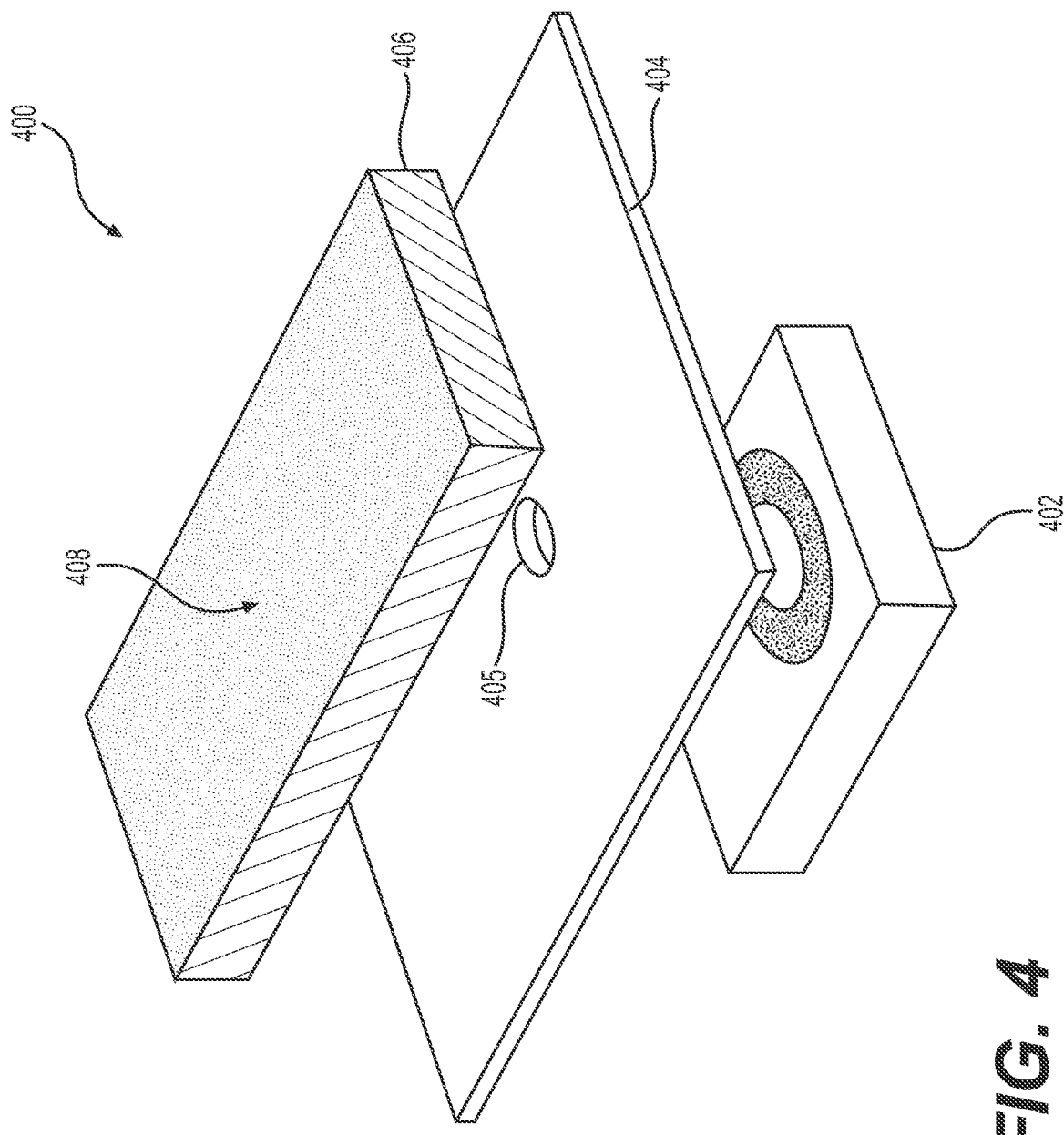
FIG. 4 is an exploded perspective view of an exemplary embodiment of a sensing element suitable for use in a conformable sensing arrangement in one or more exemplary embodiments.

In exemplary embodiments, the low wavenumber array sensing elements 302 are realized as MEMS microphones or fluctuating surface pressure (FSP) load sensing devices. In exemplary embodiments, the MEMS microphone sensing elements 302 are mounted or otherwise affixed to the electronics substrate 310 in a manner that is configured to attenuate turbulence. In this regard, FIG. 4 depicts an exploded view of an exemplary embodiment of a MEMS microphone 402 (e.g., sensing element 302) mounted to a region of an electronics substrate 404 (e.g., substrate 310) in a manner that is configured to reduce the exposure of the MEMS microphone 402 to turbulence. In the illustrated embodiment, the MEMS microphone 402 is mounted to a backside surface of the electronics substrate 404 with a hole, bore or similar cutout region 405 being provided in the substrate 404 to expose the MEMS microphone 402 to the fluid flow on the exposed surface of the substrate 404 opposite the MEMS microphone 402. An acoustic foam or similar porous material 406 is affixed or otherwise mounted to the exposed surface of the substrate 404 and aligned with or otherwise overlying the pressure sensing hole 405 to attenuate high wavenumber pressure fluctuations at the MEMS microphone 420 from the dominant low wavespeed turbulence loading. A micro-perforated stainless-steel windscreen or similar material 408 is provided on the exposed surface of the acoustic foam 406 and similarly aligned with respect to the pressure sensing hole 405 to minimize self noise from the microphone sensing ports and/or the aerodynamically rough surface of the acoustic foam layers.

Figure 3:
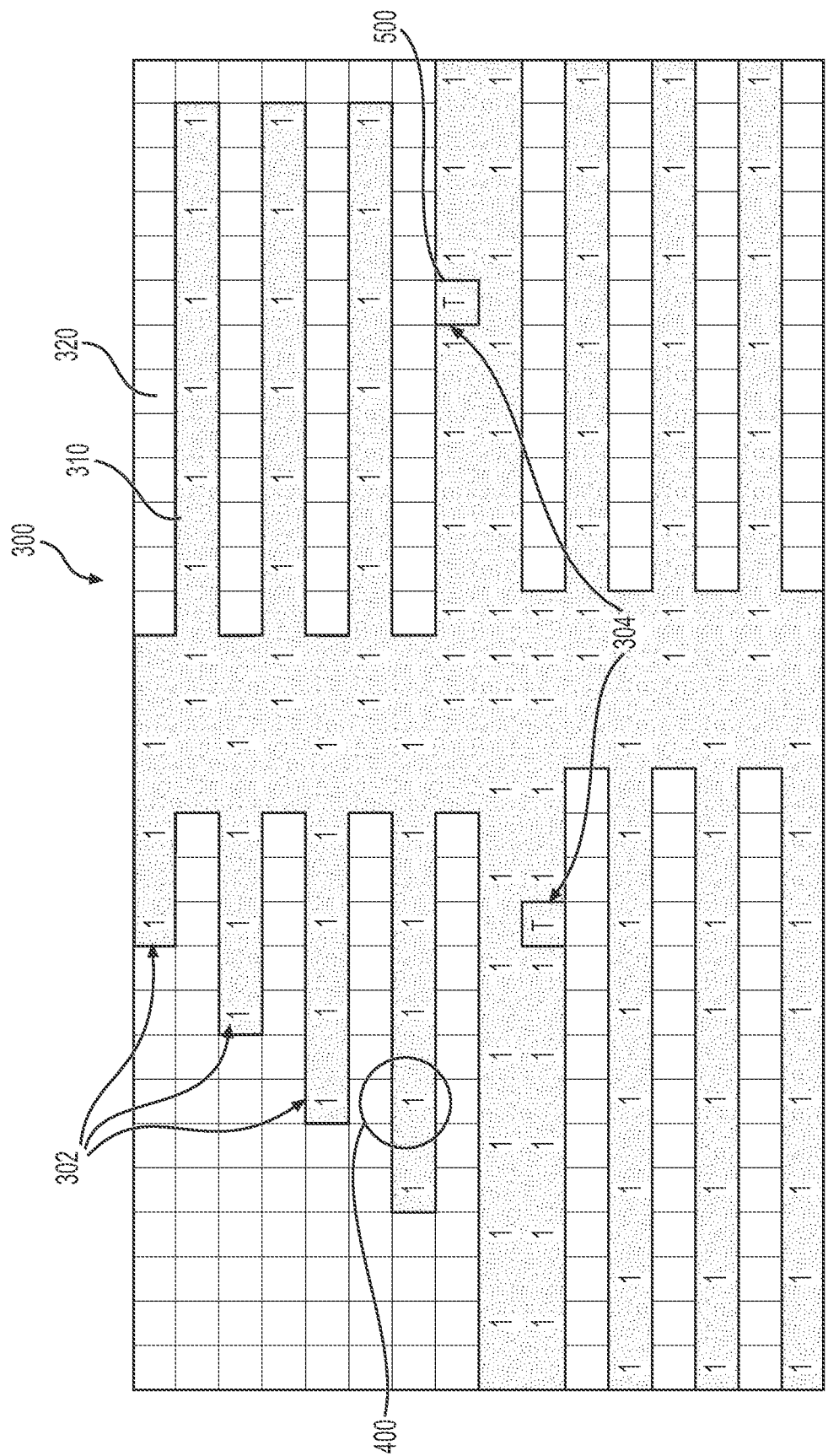
FIG. 3 is a top plan view of a conformable sensing arrangement in an exemplary embodiment.
Figure 5:
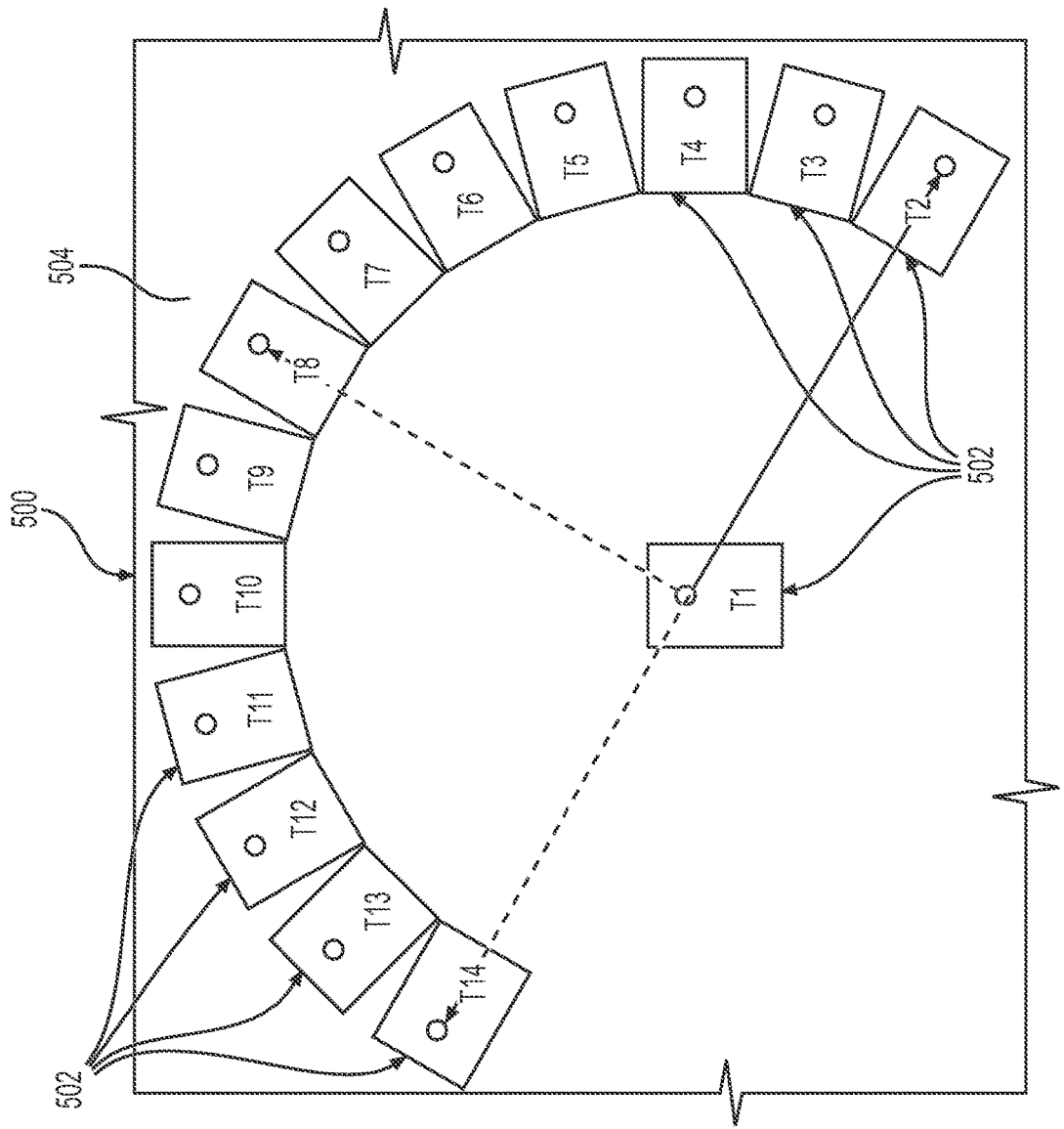
FIG. 5 is a detail top plan view of a sub-array suitable for use in a conformable sensing arrangement in one or more exemplary embodiments.

Referring to FIG. 3 and with reference to FIG. 5, in exemplary embodiments, the high wavenumber sub-arrays 304 include multiple concentrated sensing elements (e.g., sensing elements 232) that are provided at distinct and disparate locations of the sensing arrangement 300. Similar to the lower wavenumber array 302, the sensing elements of the higher wavenumber sub-arrays 304 may be realized as MEMS microphones or fluctuating surface pressure (FSP) load sensing devices. For example, FIG. 5 depicts an exemplary embodiment of a high wavenumber sub-array 500 suitable for use as a sub-array 304 in the embodiment of FIG. 3. Each high wavenumber sub-array 304, 500 may include multiple MEMS microphones 502 (e.g., sensing elements 232) that are more densely situated with respect to one another relative to the low wavenumber array sensing elements 302 when mounted or otherwise provided on an electronics substrate 504 (e.g., substrate 310). In the illustrated embodiment, the MEMS microphones 502 arranged in an arc about a central MEMS microphone 502. Similar to the MEMS microphones 402 of the low wavenumber array, the high wavenumber MEMS microphones 502 may be mounted, affixed, or otherwise provided on the backside surface of the substrate 504 and exposed to fluid flow via corresponding aligned holes, bores, or cutouts in the substrate 504. In exemplary embodiments, the MEMS microphones 502 of the high wavenumber sub-arrays 304 are exposed to the fluid flow without intervening elements that would attenuate turbulence, that is, the acoustic foam 406 and the windscreen layer 408 do not overlap or otherwise align with the MEMS microphones 502.

Figure 6:
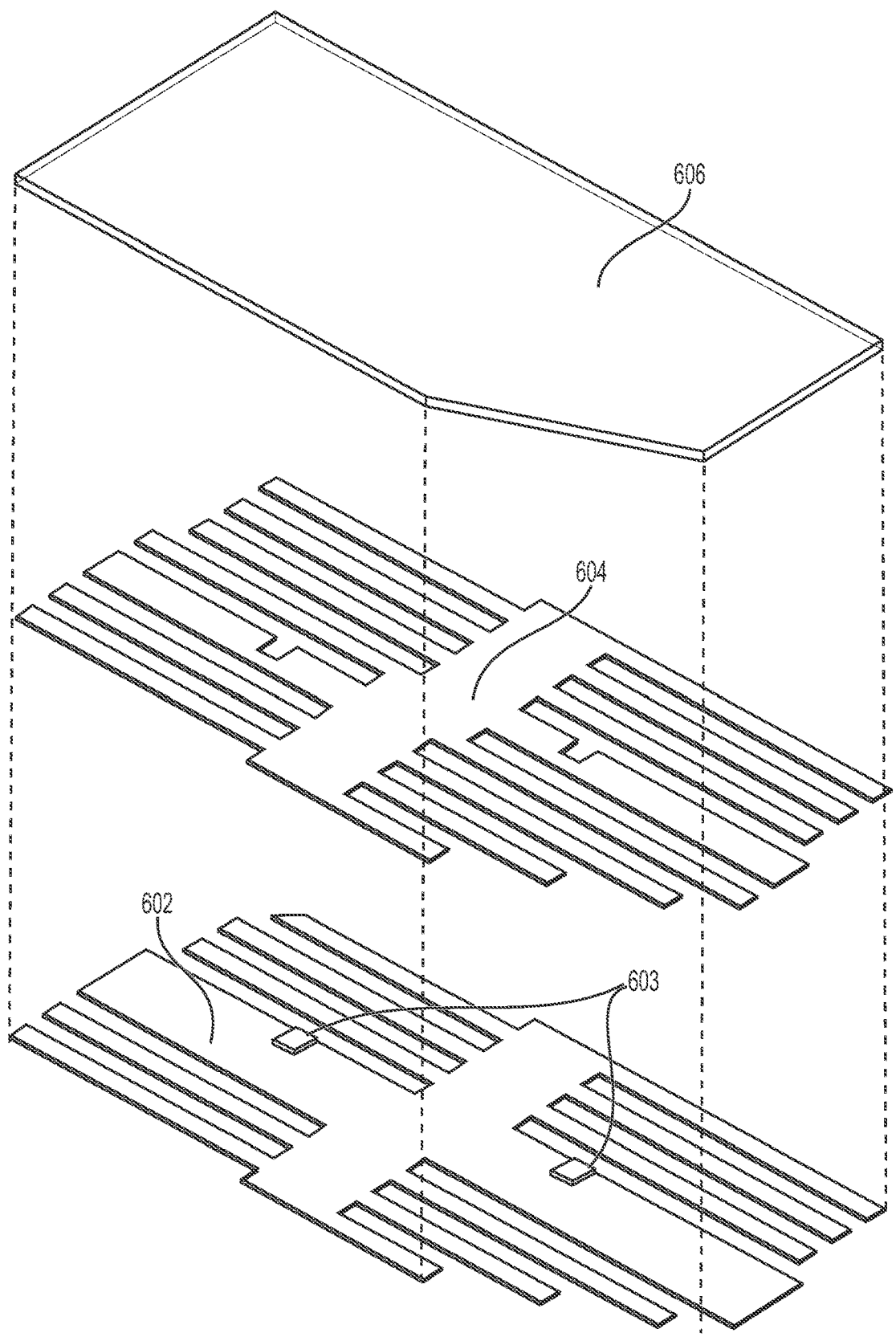
FIG. 6 is an exploded perspective view of a conformable sensing arrangement in an exemplary embodiment.

FIG. 6 depicts an exploded view of a conformable sensing arrangement suitable for use as the sensing arrangement 300 of FIG. 3. The sensing arrangement includes a flexible electronics substrate layer 602 with a turbulence attenuating layer 604 (e.g., acoustic foam 406 and overlying windscreen 408) mounted, affixed, or otherwise provided on the exposed surface of the flexible electronics substrate layer 602. The turbulence attenuating layer 604 includes voids or cutout regions aligned with the high wavenumber sub-array regions 603 of the flexible electronics substrate layer 602 to allow the high wavenumber sub-array sensing elements (e.g., sensing elements 232) to be exposed to turbulent fluid flow while attenuating turbulent portions from the fluid flow to which the low wavenumber sensing elements 222 is exposed. A conformable encapsulating layer 606 is mounted, affixed, or otherwise provided on the exposed surface of the turbulence attenuating layer 604 to encase or otherwise encapsulate the flexible electronics substrate layer 602 and the turbulence attenuating layer 604. As described above, in exemplary embodiments, the encapsulating layer 606 may be desirably be made as thin as practicable with uniform thickness to improve aerodynamic characteristics of the conformable sensing arrangement and limit or otherwise minimize fluid flow perturbations attributable to the geometry of the conformable sensing arrangement.

Figure 7:
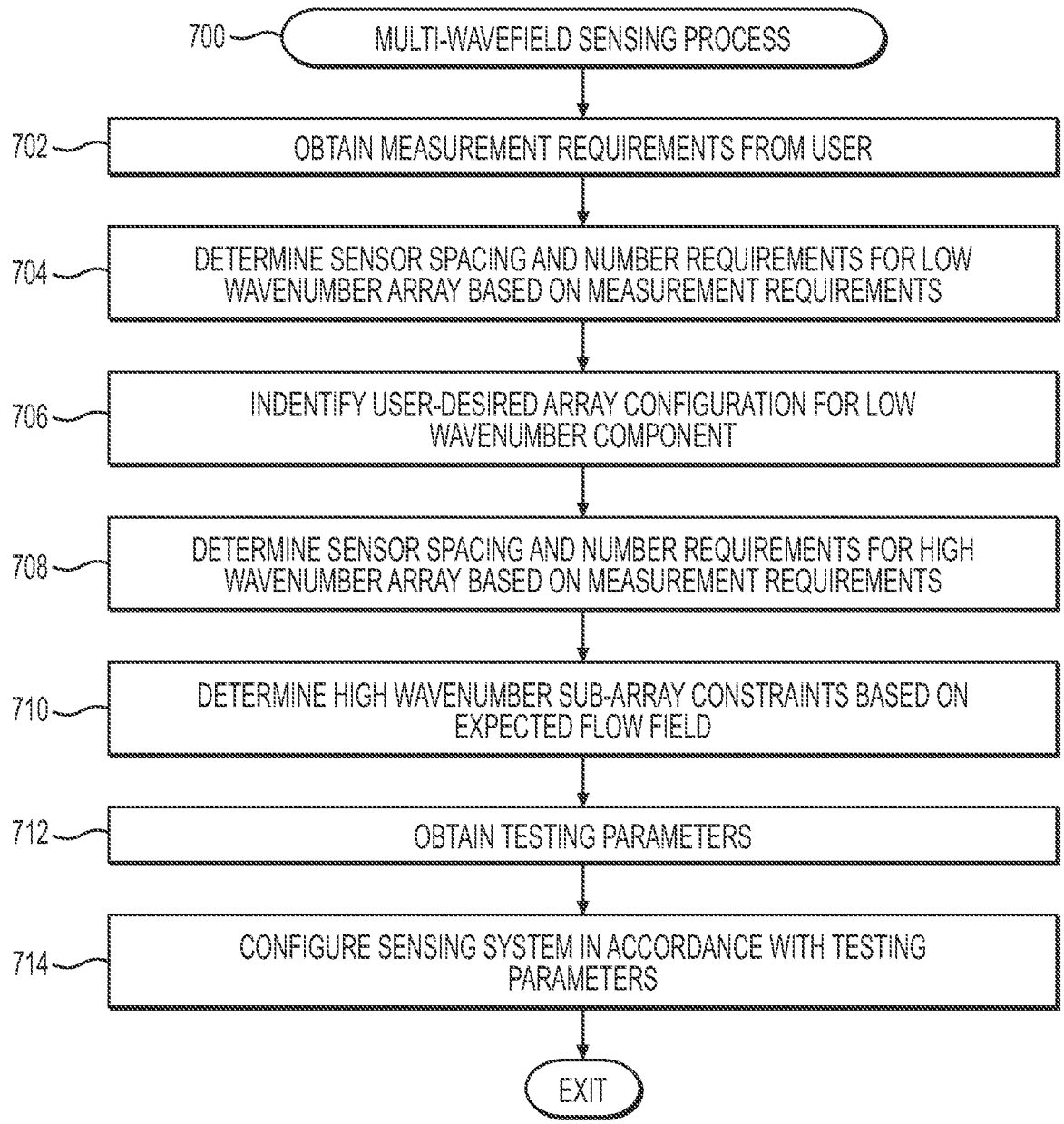
FIG. 7 is a flow diagram of an exemplary multi-wavefield sensing process suitable for use with a conformable sensing arrangement in one or more exemplary embodiments.

FIG. 7 is a flow chart that illustrates an embodiment of a multi-wavefield sensing process 700 suitable for implementation in connection with the sensor system 100 of FIG. 1. The various tasks performed in connection with the multi-wavefield sensing process 700 may be performed by software, hardware, firmware, or any combination thereof. For illustrative purposes, the following description of the multi-wavefield sensing process 700 may refer to elements mentioned above in connection with FIGS. 1-6. In an exemplary embodiment, one or more aspects of the multi-wavefield sensing process 700 is implemented at or by the computing device 112 (e.g., by a software application executed at the computing device 112). It should be appreciated that the multi-wavefield sensing process 700 may include any number of additional or alternative tasks, the tasks shown in FIG. 7 need not be performed in the illustrated order, and the multi-wavefield sensing process 700 may be incorporated into a more comprehensive procedure or process having additional functionality not described in detail herein. Moreover, one or more of the tasks shown in FIG. 7 could be omitted from an embodiment of the multi-wavefield sensing process 700 as long as the intended overall functionality remains intact.

The illustrated embodiment of the multi-wavefield sensing process 700 begins by receiving, obtaining, or otherwise identifying the desired measurement requirements to be satisfied from a user (task 702). For example, a user may manipulate graphical user interface (GUI) elements on a GUI display (e.g., presented at computing device 112) to select, input, or otherwise provide values for properties, characteristics, attributes or other parameters of the operating environment for which fluid flow measurements are to be obtained, such as, for example, the size and shape of the measurement domain, the minimum and maximum frequencies defining the range of frequencies to be measured, the desired wavenumber resolution for the low wavenumber flow component, the desired wavenumber resolution for the high wavenumber flow component, the number of components in the flow wavenumber-frequency spectrum, the estimated autospectrum level and spatial correlation for the respective components in the flow wavenumber-frequency spectrum, and/or other parameters characterizing the low and high wavenumber fluid flow components.

The multi-wavefield sensing process 700 continues by calculating or otherwise determining the constraints for the sensing elements of the low wavenumber array based on the desired measurement requirements (task 704). In this regard, the multi-wavefield sensing process 700 determines the minimum spacing between sensing elements and the minimum number of sensing elements for the low wavenumber array in order to achieve the desired wavenumber resolution for the low wavenumber flow component as described above. For example, a spatial array of sensors is required for spatial Fourier analysis of the distributed FSP loading which is statistically random in both space and time. Spatial Fourier analysis of the sensor data is required for subsequent wavenumber filtering of the acoustics loading spectrum component in the total FSP loading spectrum.

As described above, in one embodiment, the multi-wavefield sensing process 700 defines the number of components in the flow wavenumber-frequency spectrum to be measured and estimates the autospectrum level and spatial correlation for each of the components in the flow wavenumber-frequency spectrum to define the characteristics that delineate the Fast (low wavenumber) components from the Slow (high wavenumber) components. The multi-wavefield sensing process 700 defines the parameters for pressure wavenumber-frequency spectrum measurement of the Fast and Slow components, such as, for example, the size and shape of the flow measurement domain, the minimum and maximum frequency of the respective components, the desired wavenumber resolution for the respective components, and the like. Based thereon, the multi-wavefield sensing process 700 computes the minimum sensor spacing and number of sensors for the Fast component measurement array and adjusts the array length to meet the wavenumber resolution requirement as described above. In exemplary embodiments, the multi-wavefield sensing process 700 estimates the high wavenumber aliasing from the Slow component and identifies or otherwise determines one or more means for minimizing aliasing error, such as, for example, a physical filter over sensors, post-processing in wavenumber domain, and/or the like. Thereafter, an array configuration (or shape) for the Fast component measurement array is chosen or otherwise identified (e.g., line, cross, circle, or other cross spectrum curve-fitting array) along with dimensionality or other constraints (e.g., full or sparse population of sensors, one-dimensional or two-dimensional, DFT wavenumber analysis configuration, etc.).

The illustrated multi-wavefield sensing process 700 continues by identifying or otherwise determining a desired shape or physical configuration for the low wavenumber sensor array (task 706). In one embodiment, the multi-wavefield sensing process 700 generates or otherwise provides a GUI display that includes a list of selectable array configurations from among which a user may select or otherwise identify a desired array configuration for the particular application or structure to be analyzed. For example, based on the minimum spacing and number of sensing elements required to achieve the desired wavenumber resolution for the low wavenumber fluid flow component, the GUI display may include graphical representations of different potential array configurations having the minimum spacing and determined number of sensing elements to allow the user to preview the potential array configurations. In one embodiment, the user may select from among any number of different one-dimensional array configurations, two-dimensional array configurations, curved or arcuate array configurations, multi-finger array configurations, and the like. The user may also be able to select or otherwise choose whether the low wavenumber sensor array is to be fully populated (e.g., with the determined minimum spacing between sensing elements uniformly across the area of the shape) or sparsely populated (e.g., a spacing between sensing elements greater than the minimum spacing).

After identifying the desired low wavenumber array configuration, the multi-wavefield sensing process 700 continues by calculating or otherwise determining the constraints for the sensing elements of the high wavenumber array based on the desired measurement requirements for the high wavenumber fluid flow component (task 708). In this regard, the multi-wavefield sensing process 700 determines the minimum spacing between sensing elements and the minimum number of sensing elements for the high wavenumber array in order to achieve the desired wavenumber resolution for the high wavenumber flow component as described above. For example, in one embodiment, the multi-wavefield sensing process 700 calculates or otherwise determines the minimum sensor spacing and number of sensors for Slow array, and then calculates or otherwise determines dimensions for the Slow component measurement array based on the wavenumber resolution requirement, the minimum sensor spacing and the minimum number of sensors. Thereafter, the multi-wavefield sensing process 700 may review the expected flow field to decide the number and corresponding locations of multiple smaller Slow component measurement sub-arrays to be incorporated in the larger Fast component measurement array. In this regard, if the Fast component measurement array sensors do not require anti-aliasing windscreens, the multi-wavefield sensing process 700 may determine locations for the Slow component measurement sub-arrays that maximize the re-use (or dual use) of individual sensors in both Slow and Fast component measurement arrays.

After determining the sensor constraints for the high wavenumber array, the multi-wavefield sensing process 700 continues by calculating or otherwise determining the constraints for the sub-arrays that make up the high wavenumber array based on the expected high wavenumber component of the fluid flow field (task 710). In this regard, the multi-wavefield sensing process 700 calculates or otherwise determines how many different sub-arrays that the determine minimum number of sensing elements should be divided into based on the number of sensing elements per grouping required to achieve the desired high wavenumber resolution. After determining the number of sub-array groupings to be utilized, the multi-wavefield sensing process 700 also determines corresponding locations for where those sub-arrays (and constituent sensing elements) should be distributed and interspersed amongst the low wavenumber array. In exemplary embodiments, the multi-wavefield sensing process 700 estimates the amount of aliasing between low and high wavenumber fluid flow components and whether or not windscreens or other attenuation mechanisms will be utilized. If attenuating elements (e.g., attenuating layer 604) will not be present, the multi-wavefield sensing process 700 identifies locations for the high wavenumber sub-arrays that maximize the number of sensing elements that can be used for both the low and high wavenumber arrays, for example, by maximizing the number of high wavenumber sensing elements that would otherwise be collocated with low wavenumber sensing elements that have already been placed (e.g., task 706).

After the multi-wavefield sensing process 700 has identified or otherwise defined the minimum number of sensors and minimum sensor spacing for the low wavenumber array, the shape or configuration of the low wavenumber array, the minimum number of sensors and minimum sensor spacing for the high wavenumber array, the number of sensors per high wavenumber sub-array and the spatial distribution of the high wavenumber sub-arrays, the corresponding sensing arrangement may be constructed as described above. For example, a flexible PCB may be cut or otherwise patterned to achieve the desired shape for the low wavenumber array and the sensing elements may be provided on the flexible PCB at the determined locations and/or with the determined sensor distributions and spatial dispositions relative to one another. An optional turbulence attenuating layer with cutout regions corresponding to the high wavenumber sub-arrays may be provided on the flexible PCB and encapsulated with the PCB using a conformable encapsulating layer, as described above in the context of FIG. 6.

Still referring to FIG. 7, the illustrated embodiment of the multi-wavefield sensing process 700 continues by receiving or otherwise obtaining testing parameters and programming or otherwise configuring the sensing system in accordance with the testing parameters (tasks 712, 714). In this regard, a user may manipulate or otherwise interact with GUI elements on a GUI display to input or otherwise provide values for parameters defining the testing procedures to be performed, such as, for example, the duration of the test, the desired sampling frequency, and/or the like. Based on the input testing parameters, the multi-wavefield sensing process 700 may calculate or otherwise determine corresponding settings for the controller 108, the RAM array 106, and/or the like, such as, for example, the digital data block size, the digital data block download time, the data block download rate, and/or the like. Thereafter, at the start of the testing procedure, the controller 108 may be commanded, signaled, or otherwise instructed to initiate capture of the measurement data from the sensor array 104 in accordance with the input testing parameters. In one embodiment, the multi-wavefield sensing process 700 identifies or otherwise determines a required measurement time record and calculates a digital data block size based on the required measurement time. The multi-wavefield sensing process 700 then calculates or otherwise determines a required data block download time and required data download rate, and in exemplary embodiments selects or otherwise utilizes a high-speed data link with the required data download rate. In some embodiments, the multi-wavefield sensing process 700 may program a downloaded controller application in accordance with the testing parameters.

As described in U.S. Pat. No. 9,921,748, the RAM array 106 may be initialized or formatted to ensure that it is ready to record new data, and a data recording operation is started by the controller 108, for example, by an attached computing device 112 may be utilized to issue a command to the controller 108 or to otherwise schedule the beginning of the data recording operation at the controller 108. During the data recording operation, the digital sensor devices (e.g., sensing elements 222 and 232) generate respective digital output signals that convey the raw digital sensor output data of interest to a RAM device that is assigned to the respective originating sensor device, wherein the digital output signals serve as inputs to the RAM devices. A common clock signal is provided to the RAM devices and/or to the digital sensor devices as needed to synchronously sample the digital output signals, thereby enabling the raw sensor output data to be synchronously written to the RAM devices. The raw digital sensor data may be maintained in the RAM array 106 until it is time to read or download the sensor data. In certain embodiments, the data recording operation ends when the RAM array has reached its data capacity. In other embodiments, the data recording operation ends after a predetermined amount of time. In yet other embodiments, the data recording operation ends in response to a user command or instruction. Thereafter, the raw digital sensor output data may be transferred from the RAM array 106 to the computing device 112 via the controller 108. As described above, a USB interface 110 may be utilized to transfer the raw sensor data to the host computing device 122 where it can be processed, analyzed, filtered, or otherwise manipulated as desired. Delaying post-recording processing in this manner allows the RAM devices to efficiently and effectively capture the raw sensor data from a large number of sensor devices in real-time and with minimal latency.

Figure 8:
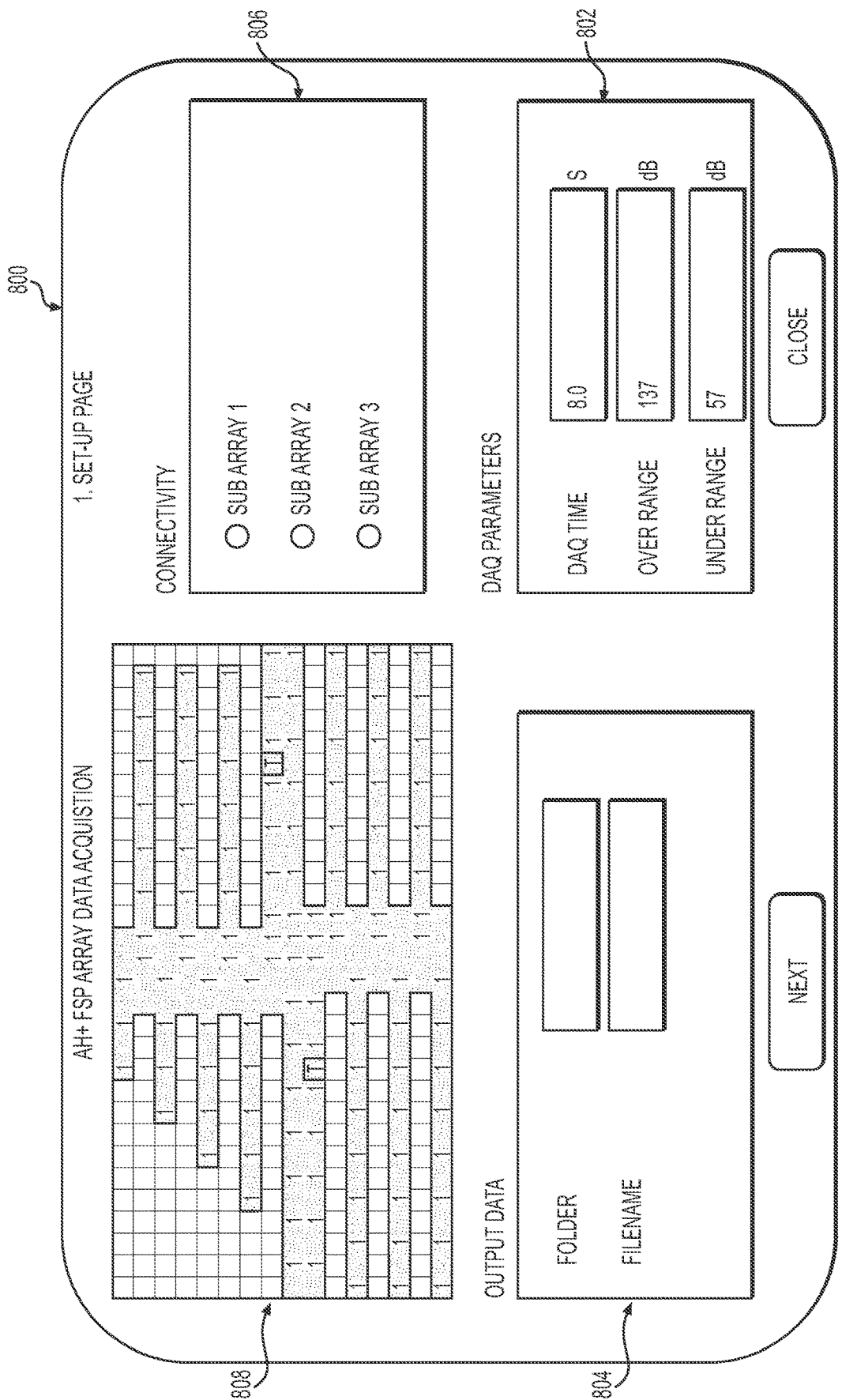
FIGS. 8-11 depict an exemplary sequence of graphical user interface (GUI) displays suitable for presentation in connection with the multi-wavefield sensing process of FIG. 7 in one or more embodiments.

FIGS. 8-11 depict exemplary GUI displays that may be presented by or on a computing device, such as computing device 112, in connection with the multi-wavefield sensing process 700 and the related subject matter described above. FIG. 8 depicts a setup GUI display 800 that may be presented on the computing device 112 that includes GUI elements 802 that allow the user to input testing parameters (e.g., task 712), such as the testing duration (or data acquisition time), along with other thresholds or parameters for the test. The illustrated setup GUI display 800 also includes a graphical representation 804 of the sensing arrangement along with a graphical representation 806 of the connectivity status of the different arrays of the sensing arrangement. The setup GUI display 800 also includes GUI elements 808 that allow the user to manage the storage of the measurement data on or at the computing device 112 after it is transferred from the RAM array 106 to the computing device 112.

Figure 9:
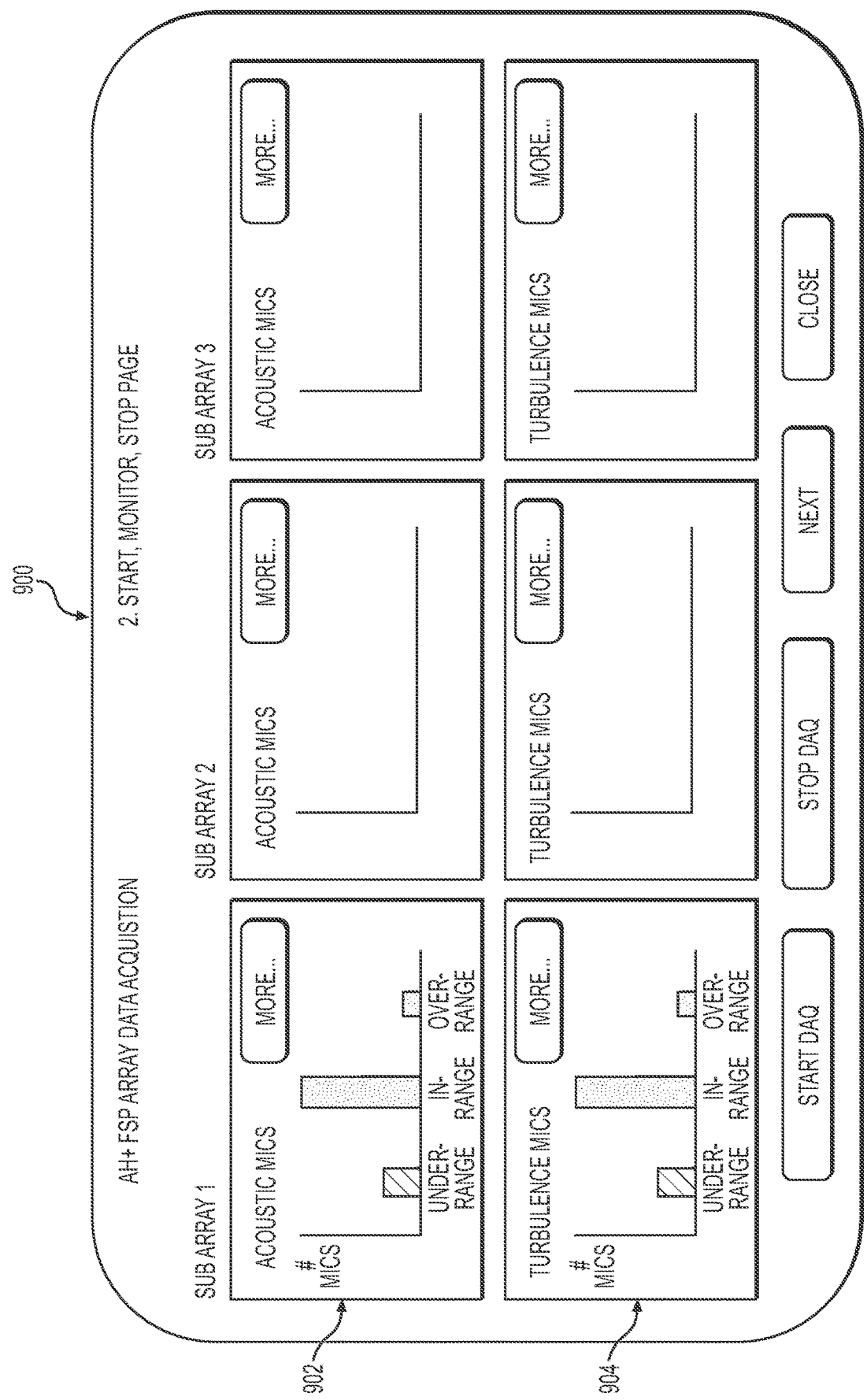

FIG. 9 depicts a measurement review GUI display 900 that may be presented during or after the data acquisition. The measurement review GUI display 900 includes a bar chart or similar GUI display 902 depicting the low wavenumber (acoustic) measurement data, such as, for example, the numerical or proportional distribution of the low wavenumber fluid flow component measurements from the low wavenumber measurement array 220 (or sensing elements 222) during the testing period above an upper threshold value, below a lower threshold value, or within the range defined by the upper and lower threshold values. Similarly, the measurement review GUI display 900 includes a second bar chart or similar GUI display 904 depicting the high wavenumber (turbulence) measurement data, such as, for example, the numerical or proportional distribution of the high wavenumber fluid flow component measurements from the low wavenumber measurement array 230 (or sensing elements 232) during the testing period above an upper threshold value, below a lower threshold value, or within the range defined by the upper and lower threshold values.

Figure 10:
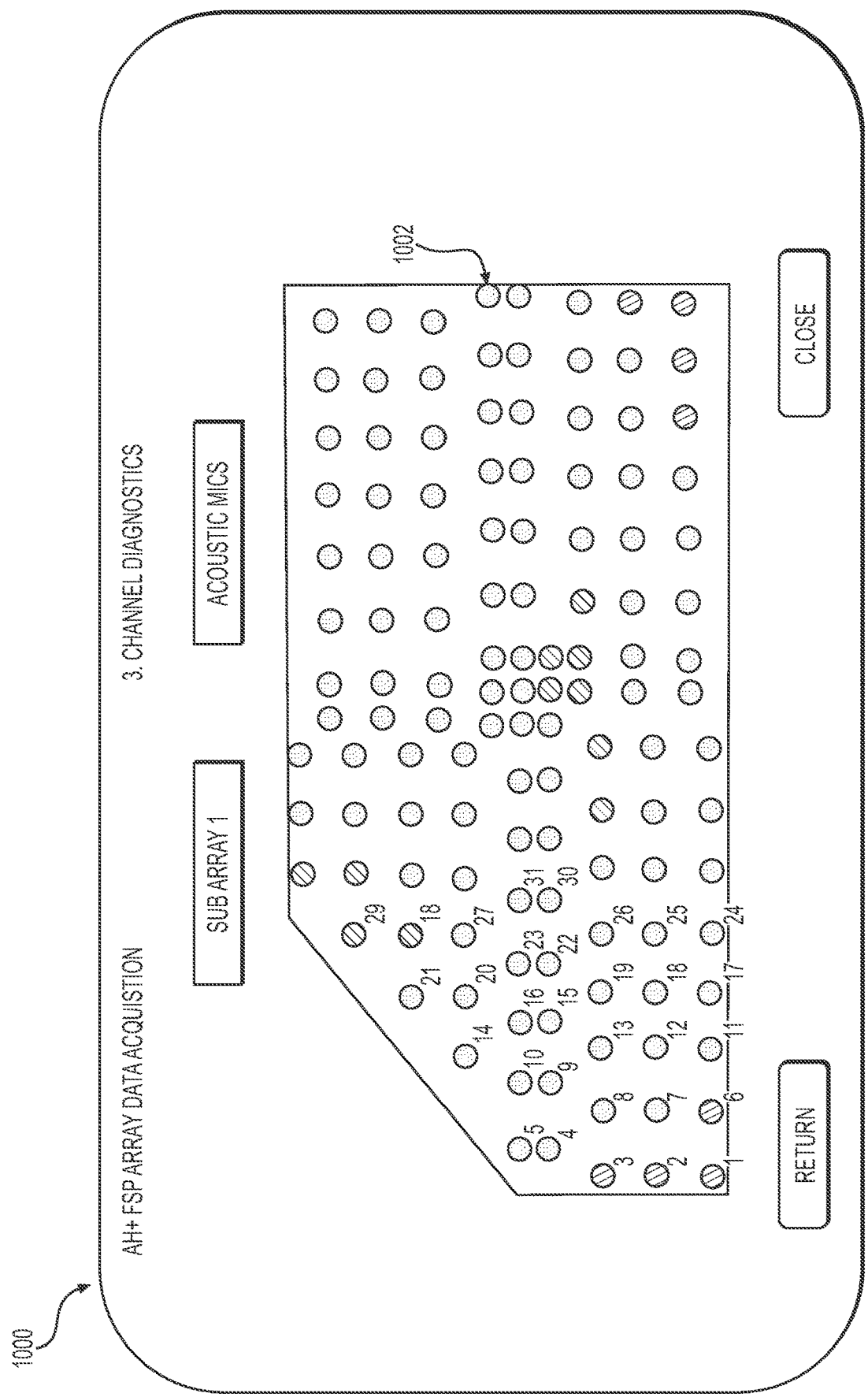

FIG. 10 depicts another example of a measurement review GUI display 1000 that may be presented during or after the data acquisition. The measurement review GUI display 1000 includes a graphical representation 1002 of the sensing arrangement including the individual sensing elements depicted at their respective locations. In this regard, in some embodiments, the sensing elements may be rendered using different visually distinguishable characteristics to indicate different attributes or statuses associated with the respective sensing elements. For example, the sensing elements may be color coded to indicate whether the respective wavenumber fluid flow component measured by that respective sensing element is above an upper measurement threshold, below a lower measurement threshold, between the upper and lower measurement thresholds, and/or the like, thereby providing graphical indication of how the impact of the fluid flow varies with respect to location. Similarly, the sensing elements may be color coded or otherwise rendered using different colors or visually distinguishable characteristics to indicate a connectivity state or operational status, the logical groupings or sub-arrays to which the respective sensing elements belong, and/or the like.

Figure 11:
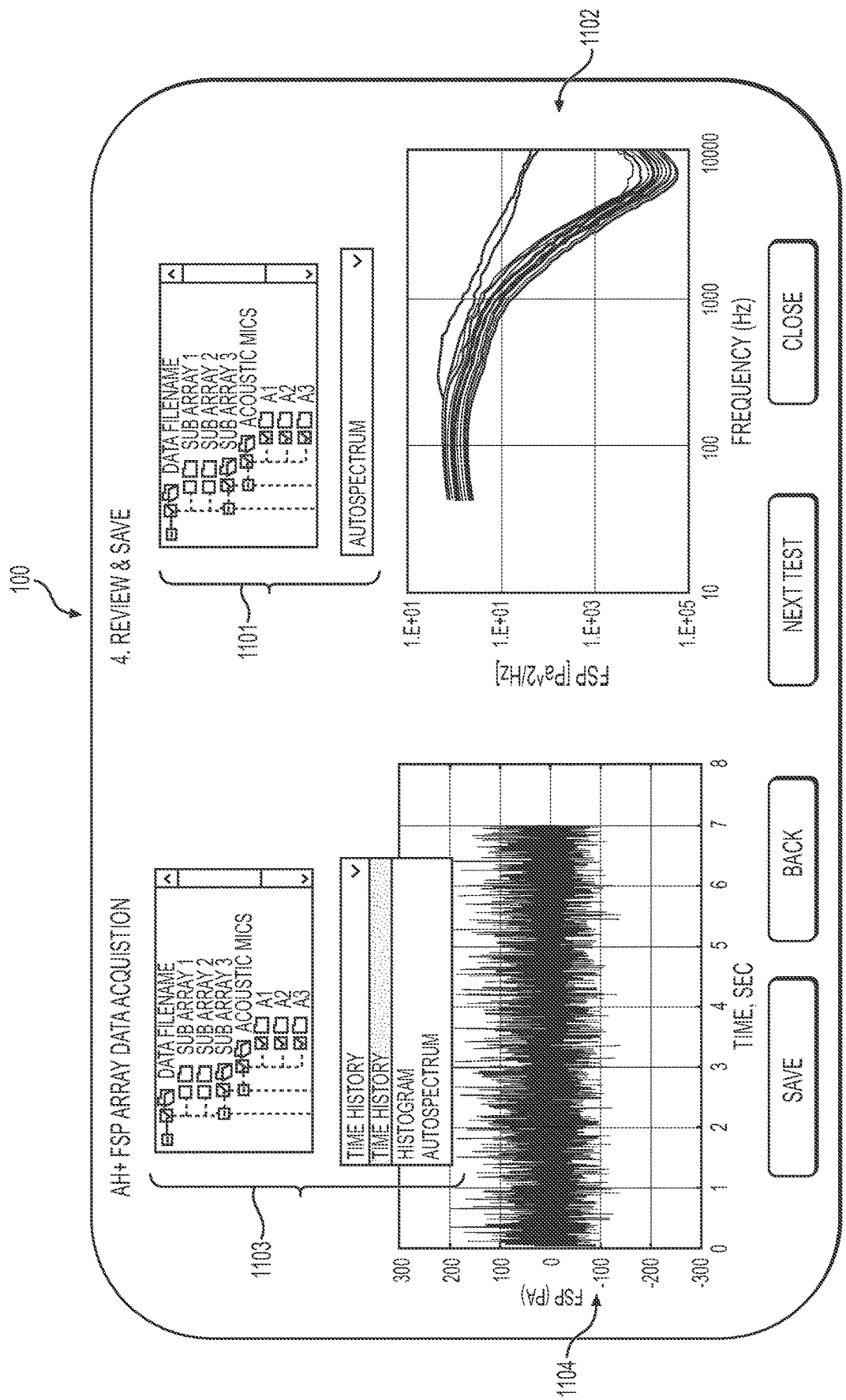

FIG. 11 depicts another example of a measurement review GUI display 1100 that may be generated or otherwise presented at a computing device (e.g., computing device 112) based on analysis of the measurement data obtained from the different sensor arrays. For example, a software application at the computing device 112 may provide GUI elements 1101, 1103, such as list boxes, drop-down menus, or the like, that allow the user to select or otherwise identify which array 220, 230 and corresponding wavenumber fluid flow component the user would like to analyze, as well as allowing the user to select or otherwise indicate the type of representation of the measurement data the user would like to analyze. For example, in response to selecting an autospectrum presentation of a measured response captured by a high wavenumber array 230, the computing device 112 (or the software application executing thereon) may analyze the measurement data captured by the sensing elements 232 of the high wavenumber array 230 to calculate or otherwise determine the autospectrum, power spectral density, or similar representation of the measured response to the high wavenumber component of the fluid flow with respect to frequency and provide a corresponding graphical representation 1102 of the measured response to the fluid flow high wavenumber component with respect to frequency on the GUI display 1100. In the illustrated embodiment, the GUI display 1100 also includes a graphical representation 1104 of the measured response to the high wavenumber component of the fluid flow with respect to time. It should be noted that FIG. 11 merely depict some exemplary representations of the measured response captured using the sensing arrangements described herein and the subject matter is not intended to be limited to any particular GUI display or graphical representation(s) provided thereon.

It will be appreciated the subject matter described herein allows for the convenient acquisition of all of the required data in a single test on an automobile body either on the road or in an aeroacoustic wind tunnel. The measurement data for the different sensor arrays can be post-processed to define the exterior wind noise source loads for a vehicle vibro-acoustic (VA) model, which, in turn, may be utilized to predict the interior wind noise sound pressure level (SPL). In this regard, for interior wind noise evaluation early in a new vehicle development program, the sensing arrangements described herein can be utilized on a reduced-scale clay model of the vehicle aerodynamic styling or similar model to facilitate design of vehicle in a manner that achieves the desired acoustic performance prior to manufacture and assembly. If predicted structure vibration or interior SPL levels are above design targets, the described process allows the aero-acoustic engineer to apply aerodynamic design changes with modeling clay or equivalent material to find an aerodynamic design with lower measured levels of wind acoustic loading and/or wind hydrodynamic turbulence loading, and consequently lower structure vibration and/or interior noise levels.

Further, the following example embodiments are also provided, which are numbered for easier reference:

Example 1: A sensing arrangement comprising: a substrate; a first sensor array on the substrate, the first sensor array comprising a first plurality of sensing elements, wherein a first distribution of the first plurality of sensing elements on the substrate is configured to obtain a first set of measurement data indicative of a first property of an operating environment; and a second sensor array on the substrate, the second sensor array comprising a second plurality of sensing elements interspersed among the first sensor array, wherein a second distribution of the second plurality of sensing arrangements on the substrate is configured to obtain a second set of measurement data indicative of a second property of the operating environment.

Example 2: The sensing arrangement of Example 1, wherein the second sensor array comprises a plurality of sub-arrays, each sub-array of the plurality comprising a respective subset of the second plurality of sensing elements.

Example 3: The sensing arrangement of Example 2, wherein a spacing between sensing elements of the respective subset of the second plurality of sensing elements of a respective sub-array is less than a second spacing between the respective sub-array and another sub-array of the plurality of sub-arrays.

Example 4: The sensing arrangement of Example 1, wherein the first property comprises a first response to a lower wavenumber component of a fluid flow and the second property comprises a second response to a higher wavenumber component of the fluid flow.

Example 5: The sensing arrangement of Example 4, wherein the first distribution comprises at least one of a minimum sensor spacing for achieving a wavenumber resolution for the lower wavenumber component and a number of sensing elements for achieving the wavenumber resolution for the first response to the lower wavenumber component.

Example 6: The sensing arrangement of Example 5, wherein the second distribution comprises a number of sub-arrays having a second minimum sensor spacing and a number of sensing elements per sub-array for achieving a second wavenumber resolution for the second response to the higher wavenumber component.

Example 7: The sensing arrangement of Example 4, further comprising an attenuation layer overlying the first plurality of sensing elements of the first sensor array.

Example 8: The sensing arrangement of Example 7, wherein the attenuation layer comprises a windscreen configured to provide an anti-aliasing filter that attenuates the higher wavenumber component.

Example 9: The sensing arrangement of Example 4, wherein modeled data for the higher wavenumber component is subtracted from the first set of measurement data to remove the higher wavenumber component, wherein the modeled data includes an estimate of at least one of discrete Fourier transform aliasing or folding error.

Example 10: The sensing arrangement of Example 1, further comprising a conformable encapsulating layer overlying the substrate, the first sensor array, and the second sensor array.

Example 11: The sensing arrangement of Example 10, wherein the conformable encapsulating layer comprises a removable adhesive material.

Example 12: The sensing arrangement of Example 1, wherein: the first sensor array is optimized for obtaining the first set of measurement data indicative of a higher wavespeed and lower wavenumber flow component of a flow-induced pressure field; and the second sensor array comprises a plurality of sub-arrays optimized for obtaining the second set of measurement data indicative of a lower wavespeed and higher wavenumber flow component of the flow-induced pressure field.

Example 13: The sensing arrangement of Example 1, wherein the substrate comprises a flexible printed circuit board.

Example 14: The sensing arrangement of Example 13, wherein the flexible printed circuit board is cut or patterned for conformability.

Example 15: The sensing arrangement of Example 14, wherein the flexible printed circuit board is patterned into a multi-finger structure or a spiral.

Example 16: The sensing arrangement of Example 1, further comprising: a random-access memory (RAM) architecture coupled to the first and second plurality of sensing elements; and a controller operatively coupled to the RAM architecture to control reading and writing operations of the RAM architecture, wherein, during a data recording operation, each sensing element of the first and second plurality of sensing elements is directly connected, electrically and physically, to the RAM architecture to facilitate synchronous writing of digital sensor output data comprising the first and second sets of measurement data.

Example 17: A method comprising: obtaining required data acquisition time and sensor over-range and under-range levels from a user; establishing a logical connection with the array instrument RAM controller; providing a graphical indication of logical connection to the array instrument and sub-array components to the user; providing a graphical means for a user to specify results data filename and folder and/or path; providing a graphical means for the user to start and stop the data acquisition; providing a means for the user to review how many sensors measured over-range and how many sensors measured under-range signals in each sub-array during the data acquisition period; and providing a means for the user to save the results data to defined filename after reviewing the number of over-range and under-range instances.

Example 18: The method of Example 17, further comprising: providing a graphical means for the user to see which sensor locations in each sub-array were subject to over-range; providing a graphical means for the user to see which sensor locations in each sub-array were subject to under-range; and providing a means for user to save the results data to defined filename after reviewing the number and location in array of over-range and under-range instances.

Example 19: A sensor system comprising: a flexible support substrate configured to be conformally mounted to curved surfaces; an array of digital sensor devices carried by the flexible support substrate, each of the digital sensor devices configured to generate a respective digital output signal that conveys raw digital sensor output data, wherein: the array of digital sensor devices comprises a lower wavenumber array comprising a first set of the digital sensor devices and a higher wavenumber array comprising a second set of the digital sensor devices; the higher wavenumber array comprises a plurality of sub-arrays comprising respective subsets of the second set of the digital sensor devices; the first set of the digital sensor devices of the lower wavenumber array are uniformly distributed across the flexible support substrate; and sub-arrays of the plurality of sub-arrays are nonuniformly interspersed amongst the first set of the digital sensor devices of the lower wavenumber array; an array of random-access memory (RAM) devices carried by the flexible support substrate, the RAM devices directly connected to the digital sensor devices during a data recording operation of the sensor system, such that the RAM devices directly receive the digital output signals; and a controller operatively coupled to the array of RAM devices to synchronously clock the array of RAM devices during the data recording operation, such that the raw digital sensor output data is synchronously written to the array of RAM devices.

Example 20: The sensor system of Example 19, wherein: each digital sensor device in the array of digital sensor devices comprises a microelectromechanical microphone device.

Example 21: A system comprising: means for obtaining required data acquisition time and sensor over-range and under-range levels from a user; means for establishing a logical connection with the array instrument RAM controller; means for providing a graphical indication of logical connection to the array instrument and sub-array components to the user; graphical means for a user to specify results data filename and folder and/or path; graphical means for the user to start and stop the data acquisition; means for the user to review how many sensors measured over-range and how many sensors measured under-range signals in each sub-array during the data acquisition period; and means for the user to save the results data to defined filename after reviewing the number of over-range and under-range instances Example 22: The system of Example 21, further comprising: graphical means for the user to see which sensor locations in each sub-array were subject to over-range; graphical means for the user to see which sensor locations in each sub-array were subject to under-range; and means for the user to save the results data to defined filename after reviewing the number and location in array of over-range and under-range instances.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A sensor system comprising:
a flexible support substrate configured to be conformally mounted to curved surfaces;
an array of digital sensor devices carried by the flexible support substrate, each of the digital sensor devices configured to generate a respective digital output signal that conveys raw digital sensor output data, wherein:
the array of digital sensor devices comprises a lower wavenumber array comprising a first set of the digital sensor devices and a higher wavenumber array comprising a second set of the digital sensor devices;
the higher wavenumber array comprises a plurality of sub-arrays comprising respective subsets of the second set of the digital sensor devices;
the first set of the digital sensor devices of the lower wavenumber array are uniformly distributed across the flexible support substrate; and
sub-arrays of the plurality of sub-arrays are nonuniformly interspersed amongst the first set of the digital sensor devices of the lower wavenumber array;
an array of random-access memory (RAM) devices carried by the flexible support substrate, the RAM devices directly connected to the digital sensor devices during a data recording operation of the sensor system, such that the RAM devices directly receive the digital output signals; and
a controller operatively coupled to the array of RAM devices to synchronously clock the array of RAM devices during the data recording operation, such that the raw digital sensor output data is synchronously written to the array of RAM devices.

2. The sensor system of claim 1, wherein:
each digital sensor device in the array of digital sensor devices comprises a microelectromechanical microphone device.

3. The sensor system of claim 1, wherein a first distribution of the first set of the digital sensor devices comprises at least one of a minimum sensor spacing for achieving a wavenumber resolution for a lower wavenumber component of a fluid flow and a number of sensing elements for achieving the wavenumber resolution for a first response to the lower wavenumber component.

4. The sensor system of claim 3, wherein a second distribution of the sub-arrays of the plurality of sub-arrays comprises a number of sub-arrays having a second minimum sensor spacing and a second number of sensing elements per sub-array for achieving a second wavenumber resolution for a second response to a higher wavenumber component of the fluid flow.

5. The sensor system of claim 1, further comprising an attenuation layer overlying the first set of the digital sensor devices of the lower wavenumber array.

6. The sensor system of claim 5, wherein the attenuation layer is configured to provide an anti-aliasing filter that attenuates a higher wavenumber component of a fluid flow.

7. The sensor system of claim 5, wherein the attenuation layer comprises a windscreen.

8. The sensor system of claim 1, wherein the controller is configurable to subtract modeled data for a higher wavenumber component of a fluid flow from a first set of measurement data from the lower wavenumber array.

9. The sensor system of claim 8, wherein the modeled data includes an estimate of at least one of discrete Fourier transform aliasing or folding error.

10. The sensor system of claim 1, further comprising a conformable encapsulating layer overlying the flexible support substrate, the lower wavenumber array, and the higher wavenumber array.

11. The sensor system of claim 10, wherein the conformable encapsulating layer comprises a removable adhesive material.

12. The sensor system of claim 1, wherein:
the lower wavenumber array is optimized for obtaining a first set of measurement data indicative of a higher wavespeed and a lower wavenumber flow component of a flow-induced pressure field; and
the plurality of sub-arrays are optimized for obtaining a second set of measurement data indicative of a lower wavespeed and a higher wavenumber flow component of the flow-induced pressure field.

13. The sensor system of claim 1, wherein the flexible support substrate comprises a flexible printed circuit board.

14. The sensor system of claim 13, wherein the flexible printed circuit board is cut or patterned for conformability.

15. The sensor system of claim 14, wherein the flexible printed circuit board is patterned into a multi-finger structure or a spiral.

16. The sensor system of claim 1, wherein a spacing between digital sensor devices of the second set of the digital sensor devices of a respective sub-array of the plurality of sub-arrays is less than a second spacing between the respective sub-array and another sub-array of the plurality of sub-arrays.

17. The sensor system of claim 1, wherein the digital output signals comprise the respective digital output signals generated by the respective digital sensor devices of the array of digital sensor devices.

18. A sensor system comprising:
a flexible support substrate configured to be conformally mounted to curved surfaces;
an array of digital sensor devices carried by the flexible support substrate, the array of digital sensor devices configured to generate digital output signals that convey raw digital sensor output data, wherein:
the array of digital sensor devices comprises a lower wavenumber array comprising a first set of the digital sensor devices and a higher wavenumber array comprising a second set of the digital sensor devices;
the higher wavenumber array comprises a plurality of sub-arrays comprising respective subsets of the second set of the digital sensor devices;
the first set of the digital sensor devices of the lower wavenumber array are uniformly distributed across the flexible support substrate; and
sub-arrays of the plurality of sub-arrays are nonuniformly interspersed amongst the first set of the digital sensor devices of the lower wavenumber array;
an array of random-access memory (RAM) devices carried by the flexible support substrate, the RAM devices directly connected to the digital sensor devices during a data recording operation of the sensor system, such that the RAM devices directly receive the digital output signals; and
a controller operatively coupled to the array of RAM devices to synchronously clock the array of RAM devices during the data recording operation, such that the raw digital sensor output data is synchronously written to the array of RAM devices.

\* \* \* \* \*